(12) United States Patent
Norman

(10) Patent No.: US 8,164,970 B2
(45) Date of Patent: Apr. 24, 2012

(54) THIRD DIMENSIONAL MEMORY WITH COMPRESS ENGINE

(75) Inventor: Robert Norman, Pendleton, OR (US)

(73) Assignee: Unity Semiconductor Corporation

( * ) Notice: Subject to any disclaimer, the term of this patent is extended or adjusted under 35 U.S.C. 154(b) by 415 days.

(21) Appl. No.: 12/586,478

(22) Filed: Sep. 22, 2009

(65) Prior Publication Data

US 2010/0161918 A1    Jun. 24, 2010

Related U.S. Application Data

(60) Provisional application No. 61/203,190, filed on Dec. 19, 2008, provisional application No. 61/203,166, filed on Dec. 19, 2008.

(51) Int. Cl.
*G11C 8/00* (2006.01)
(52) U.S. Cl. ............ 365/230.03; 365/238.5; 365/230.01
(58) Field of Classification Search ............. 365/230.03, 365/238.5, 230.01; 711/209, 217, 158
See application file for complete search history.

(56) References Cited

U.S. PATENT DOCUMENTS 7,755,968 B2 *   7/2010   Woo et al. ................ 365/230.03

* cited by examiner

*Primary Examiner* — David Lam

(57) ABSTRACT

An integrated circuit and method for modifying data by compressing the data in third dimensional memory technology is disclosed. In a specific embodiment, an integrated circuit is configured to perform compression of data disposed in third dimensional memory. For example, the integrated circuit can include a third dimensional memory array configured to store an input independent of storing a compressed copy of the input, a processor configured to compress the input to form the compressed copy of the input, and a controller configured to control access between the processor and the third dimensional memory array. The third dimension memory array can include one or more layers of non-volatile re-writeable two-terminal cross-point memory arrays fabricated back-end-of-the-line (BEOL) over a logic layer fabricated front-end-of-the-line (FEOL). The logic layer includes active circuitry for data operations (e.g., read and write operations) and data compression operations on the third dimension memory array.

31 Claims, 16 Drawing Sheets

THIRD DIMENSIONAL MEMORY WITH
COMPRESS ENGINE

FIELD OF THE INVENTION

Embodiments of the invention relate generally to data storage and data compression, and more particularly, to systems, integrated circuits and methods for third dimensional memory with compression engine implementing, for example, non-volatile memory technology.

BACKGROUND OF THE INVENTION

Conventional electronic devices, such as a digital camera, have incorporated compression systems, which typically require exhaustive integrated circuit solutions. Manufacturing additional hardware to provide high-speed compression typically comes at a high cost by including multiple processing chipsets. Some conventional solutions typically include a digital signal processor ("DSP") to reduce costs and provide flexibility for system alterations; however, compression rates are greatly reduced.

In some conventional solutions, compression of data has typically used non-volatile memory such as flash memory, thus providing higher density on a given chip area. However, using flash memory has a few drawbacks. For example, flash memory performs write operations in multiple successions, such as performing an erase operation prior to any write operation in order to clear the selected memory cell accordingly, which typically slows down the rate of storing compressed data. In some conventional solutions, adding an erase operation typically requires additional circuitry to handle an extra cycle of operation, thus increasing die area and cost per bit. Also, flash memory typically requires additional file management software that must be mapped on top of a standard file management structure in order to perform an erase operation only to memory cells with written data. Further, adding circuitry to perform an erase operation typically requires high amperage to complete the erase operation, thus increasing usage of battery power.

In other conventional solutions, data provided to an analog-to-digital converter from an imaging device is typically forwarded to a frame buffer, and captures the data prior to compression. However, buffering data prior to compression typically requires additional circuitry, thus increasing power consumption and reducing compression rates. Also, transferring data from a frame buffer to a processor is typically delayed when new data is detected. Further, detecting new data typically requires a complex file manager to handle multiple modes of operation, such as resuming and suspending operations to store or compress data including the new data.

There are continuing efforts to improve techniques for storing and compressing data.

BRIEF DESCRIPTION OF THE DRAWINGS

Various examples are disclosed in the following detailed description and the accompanying drawings, in which.

Figure 1A:
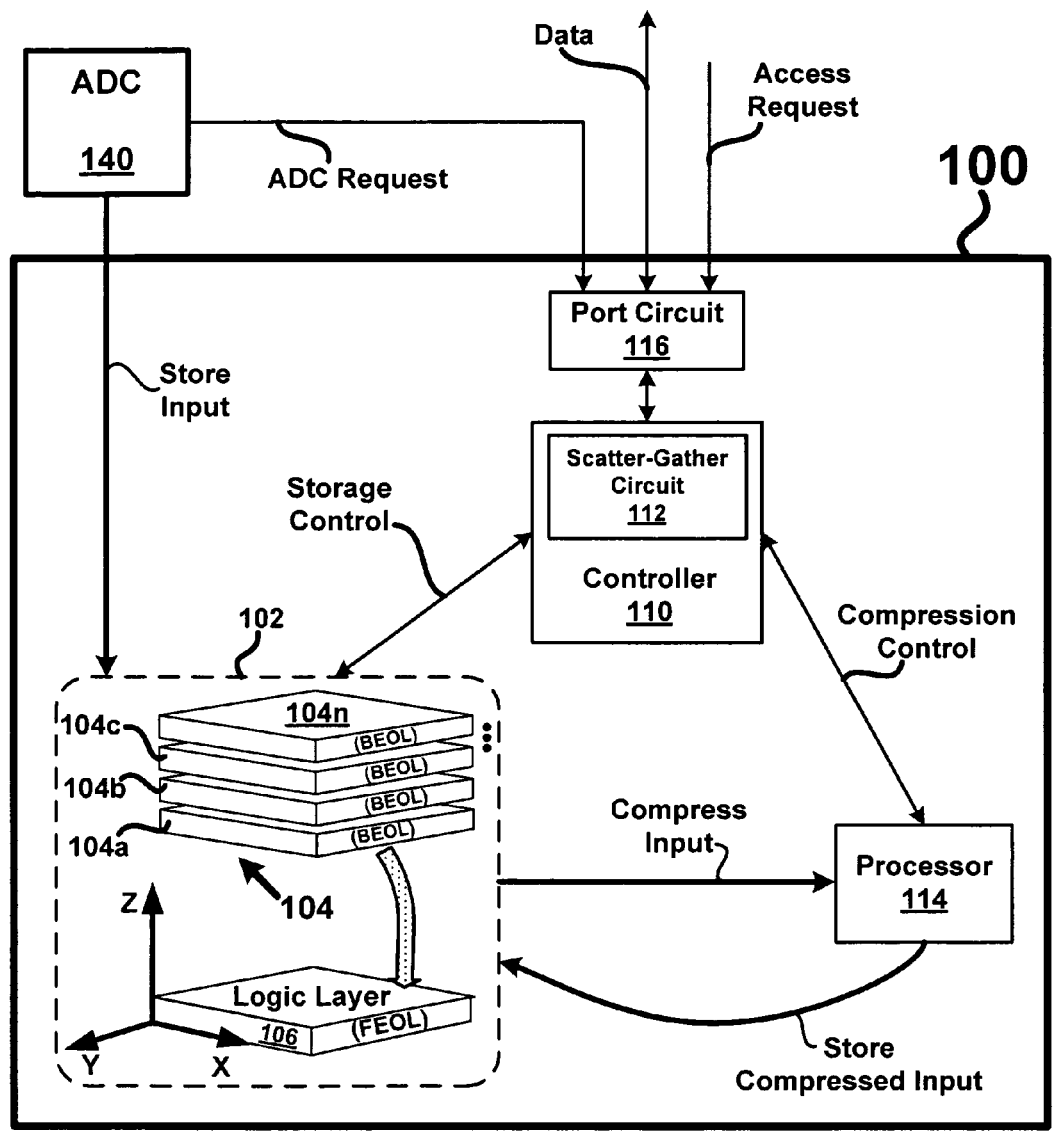
FIG. 1A depicts an exemplary system of a third dimensional memory with compression engine.

Although the previous drawings depict various examples of the invention, the invention is not limited by the depicted examples. It is to be understood that, in the drawings, like reference numerals designate like structural elements. Also, it is understood that the depictions in the FIGS. are not necessarily to scale.

DETAILED DESCRIPTION

FIG. 1A depicts an exemplary system of a third dimensional memory with compression engine. System 100 includes third dimensional memory array 102 including multiple planes, tiers, or otherwise layers ("layers") 104 of memory formed on top of each other (e.g., array layers 104a, 104b, 104c, . . . , 104n in the Z direction along the +Z axis), logic layer 106 (e.g., along −Z axis), controller 110, scatter-gather circuit 112, processor 114, and a port circuit 116. As used herein, the term "layer" refers generally, to a flat, conceptual surface passing containing, for example, the X and Y axes, the Y and Z axes, or the Z and X axes, as well as any similar surface that is parallel to any of the aforementioned axes. In some examples, system 100 can implement a compression engine to modify data being stored in third dimensional memory array 102. For example, a compression engine can be configured for processing, translating, formatting, or otherwise compressing. In other examples, controller 110 can control access between third dimensional memory array 102 and processor 114. In some examples, processor 114 can compress an input from analog-to-digital converter 140 (ADC) being stored in third dimensional memory array 102. As used herein, the term "input" can refer generally, to data entered into a computer system (e.g., system 100) for processing. In other examples, processor 114 can compress an input from other sources (e.g., graphics controller, central processing unit (CPU), memory card, or others) connected with system 100. In some examples, third dimensional memory array 102 can store both an input and a compressed copy of the input. For example, third dimensional memory array 102 can store an input on a different memory layer from a compressed copy of the input. In another example, third dimensional memory array 102 can store an input on a common plane with a compressed copy of the input. In other examples, third dimensional memory array 102 can replace an input with a compressed copy of the input. In some examples, controller 110 can include a scatter-gather circuit 112 to manage storage of an input and a compressed copy of the input across one or more memory layers in third dimensional memory array 102. In other examples, scatter-gather circuit 112 can locate an input stored non-contiguously (i.e., a portion of the input not bordering another portion of the input) in one or more memory layers of third dimensional memory array 102. In still other examples, scatter-gather circuit 112 can locate a compressed copy of an input stored contiguously (or non-contiguously) in one or more memory layers of third dimensional memory array 102. In some examples, controller 110 can store data used by scatter-gather circuit 112 using a portion of third dimensional memory array 102. For example, a portion can be a slice of one or more memory layers with access independent of an input (or compressed copy of the input) being stored in third dimensional memory array 102. In other examples, controller 110 can store data used by processor 114 using another portion of third dimensional memory array 102. For example, processor 114 can request to store data it uses for processing (e.g., compression of an input). Further, third dimensional memory array 112 can store multiple sets of data (e.g., data from an input, a scatter-gather circuit, a processor, or others) independently into one or more memory layers using controls from controller 110, in connection with, scatter-gather circuit 112.

In FIG. 1A, the logic layer 106 can be a silicon wafer upon which active circuitry (e.g., CMOS devices) for performing data operations (e.g., read and write operations) on the one or more layers of memory 104 (e.g., the array layers 104$a$, 104$b$, 104$c$, . . . , through layer 104$n$). The logic layer 106 and its associated circuitry are fabricated on the wafer as part of a front-end-of-the-line (FEOL) fabrication process. The one or more layers of memory 104 are fabricated directly on top of the logic layer 106 as part of a back-end-of-the-line (BEOL) fabrication process. The FEOL and BEOL processes can occur at the same or different fabrication facilities and the same or different vendors may perform the FEOL and BEOL processes. The active circuitry in logic layer 106 can include some or all of the non-memory related circuitry (e.g., not the one or more layers of memory 104) described herein, such as circuitry 110, 112, 114, 116, and 140 of FIG. 1A, or the circuitry depicted in FIGS. 1B through 6, for example. The active circuitry in logic layer 106 can include circuits that are not related to data operations on the memory 104.

In some examples, system 100 can receive a request from one or more sources to access third dimensional memory array 102. As used herein, the term "access" refers generally, to a granted operation in memory such as a read or a write. For example, ADC 140 can send a request to controller 110 to store an input in third dimensional memory array 102. In other examples, port circuit 116 can receive an input from a source (e.g., ADC 140), and forward the input for storage. In still other examples, port circuit 116 can decode an input, and provide to controller 110 with one or more commands from the input. Further, a command can be an instruction including one or more bytes of data for use by controller 110. For example, a command can instruct controller 110 to store and compress an input simultaneously (or substantially simultaneously). In some examples, controller 110 can form a command block from one or more bytes of data decoded by port circuit 116. In other examples, controller 110 can be commanded by a source within system 100 (e.g., processor 114). For example, processor 114 can send a command to controller 110 to store a compressed copy of an input, and request to send another input to compress.

In some examples, controller 110 can send a write operation (i.e., providing a write voltage to one or more memory layers) to third dimensional memory array 102 and store an input (or a compressed copy of the input). In other examples, controller 110 can access third dimensional memory array 102 to read out an input from a common layer with a compressed copy of the input. In still other examples, controller 110 can access third dimensional memory array 102 to read out one or more portions of an input (or compressed copy of the input) from multiple layers of memory. In yet other examples, controller 110 can receive another command decoded by port circuit 116 instructing to compress an input following (or immediately following) storage of the input. For example, controller 110 can provide storage control and compression control simultaneously (or substantially simultaneously) to third dimensional memory array 102 and processor 114, respectively. In yet still other examples, controller 110 can receive a command to compress an input in parallel (or substantially in parallel) to a write operation of the input. For example, a write operation of an input in third dimensional memory array 102 can be occurring when controller 110 grants a command to compress the input (or portion thereof) before completing the write operation.

In some examples, controller 110 can use scatter-gather circuit 112 to locate an input in one or more memory layers of third dimensional memory array 102. For example, an input can be disjoined (i.e., not bordering successively) from another input when being stored in third dimensional memory array 102. In other words, an input can be stored within third dimensional memory array 102 in discontinuous memory locations from another input. As used herein, the term "memory location" refers generally, to a portion of third dimensional memory array 102 that can be identified by its starting address and memory size. Further, scatter-gather circuit can use a process to locate each disjoined input in one or more memory layers. Also, scatter-gather circuit 112 can locate a compressed copy of an input in third dimensional memory array 102. In some examples, an input located by scatter-gather circuit 112 can be used as a command, and the command can be joined with another command from another input to form a chain of commands. For example, a command used by scatter-gather circuit 112 can provide information in locating an input (or compressed copy of the input), such as providing a pointer, an offset, a flag, and the like. In other examples, scatter-gather circuit 112 can use a chain of commands to locate an input (or compressed copy of the input)

stored in one or more memory locations across third dimensional memory array 102. In some examples, scatter-gather circuit 112 can use data generated by a processor (e.g., processor 114, external processor, or other processor connected with system 100). For example, data generated by a processor can provide information about the processor to form a processor mailbox, which can be used by another processor accessing third dimensional memory array 102. In other words, a processor mailbox can store information about a processor (e.g., program settings) using a portion of third dimensional memory array 102. In other examples, scatter-gather circuit 112 can use an input that includes a port address. In other words, scatter-gather circuit 112 can maintain information about a source sending an input to third dimensional memory array 102. Further, a port address can include a pointer providing a starting address of a command chain to initiate a process used by scatter-gather circuit 112. As used herein, the term "pointer" refers generally, to an identifier providing a location in memory. In still other examples, scatter-gather circuit 112 can read (or write) data after requesting to access third dimensional memory array 102. Also, data used by scatter-gather circuit 112 can be stored in one or more memory layers (or portion thereof). In yet other examples, system 100 can include a priority circuit (not shown), to resolve a request from more than one port requesting access to third dimensional memory array 102 (or processor 114).

In some examples, processor 114 can compress an input independent of receiving a control signal from controller 110. In other words, processor 114 can process an input using a chain of commands gathered by scatter-gather circuit 112. In other examples, a chain of commands can be stored for use by processor 114 using a portion of third dimensional memory array 102. In still other examples, processor 114 can generate data used for processing including compression of an input. For example, processor 114 can generate compressed data, encryption keys, and interim calculations, which can be stored in a portion of third dimensional memory array to form a processor memory. In yet other examples, a processor memory can provide processor 114 with negligible (or substantially negligible) delay during compression of an input.

In some examples, third dimensional memory array 102 can be accessed from more than one port simultaneously (or substantially simultaneously) using port circuit 116. For example, port circuit 116 can be connected to one or more ports. Further, each port can access third dimensional memory array 102 simultaneously (or substantially simultaneously) independent of a port conflict. For example, a port can request to access a resource in parallel to another port requesting the resource, hence a port conflict. As used herein, the term "resource" refers generally, to an available source used for storing or processing found in system 100. In other examples, port circuit 116 can receive an input using a wide data interface. For example, a wide data interface can include one or more bytes (i.e., 8 bits) of data to provide multiple commands embedded in the input. Further, port circuit 116 can forward an input having a wide data interface using additional buffering to controller 110. Also, controller 110 can use multiple commands to provide simultaneous (or substantially simultaneous) operations between third dimensional memory array 102 and processor 114.

In some examples, third dimensional memory array 102 can provide storage for data using a portion independent of another portion on a common layer of memory. In other examples, third dimensional memory array 102 can use more than one memory layer to store data using scatter-gather circuit 112 to store a record of each operation. As used herein, the term "record" refers generally, to preserving information or data identifying a location in memory (e.g., a pointer, an offset, or others). In still other examples, system 100 can include one or more of controller 110 and processor 114 connected to third dimensional memory array 102 without increasing the die size of, for example, logic layer 106 or a substrate (not shown) upon which logic layer 106 is formed. For example, forming controller 110 (or portion thereof) in multiple layers 104 of third dimensional memory array 102 affects the Z dimension (e.g., along the +Z axis) of system 100 rather than the X and Y dimensions. Also, controller 110 and processor 120 can be formed using logic found in logic layer 106 without increasing a die size. Further, controller 110 can access one or more memory locations in third dimensional memory array 102 simultaneously (or substantially simultaneously). Still further, a memory location in third dimensional memory array 102 can have relatively a small footprint (i.e., chip area on a die), which can translate to a fast access time of the memory location.

Figure 1B:
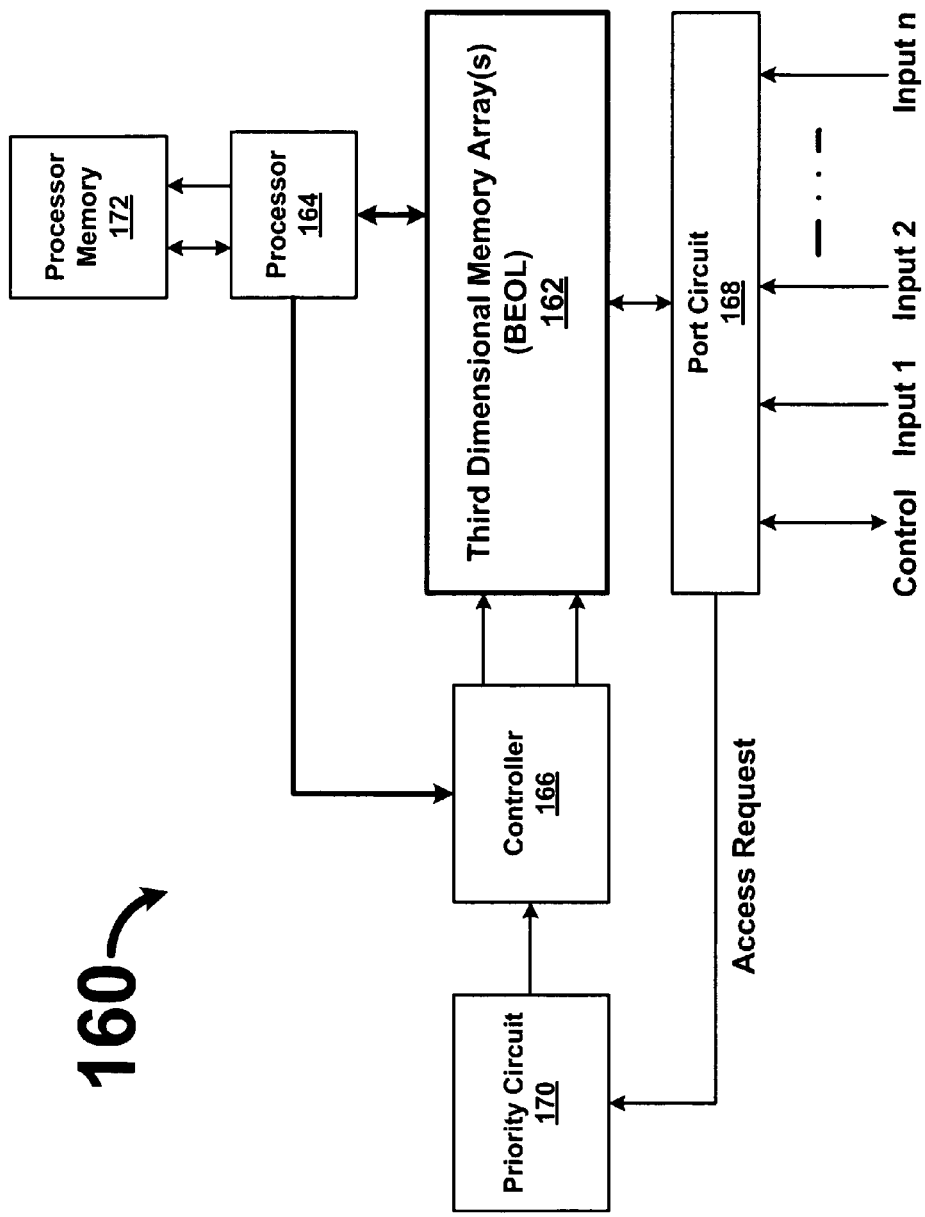
FIG. 1B depicts an exemplary implementation of a third dimensional memory with compression engine.

FIG. 1B depicts an exemplary implementation of a third dimensional memory with compression engine. Here, system 160 can be configured to include third dimensional memory array 162, processor 164, controller 166, port circuit 168, priority circuit 170, and processor memory 172. Some or all of the circuitry for implementing the processor 164, controller 166, port circuit 168, and priority circuit 170 can be fabricated FEOL with the one or more layers of memory in the third dimensional memory array 162 fabricated BEOL directly on top of the FEOL layer. In some applications, the processor memory 172 can be BEOL memory that is separate from the memory 162 or can be BEOL memory that is an allocated sub-portion of memory 162 (see 206 in FIG. 2). In some examples, port circuit 168 can receive an input from one or more sources (e.g., ADC, graphics controller, CPU, or others). In other examples, a control signal can be received by port circuit 168, in connection with, an input to provide a command (or instruction) for use by controller 166. In still other examples, third dimensional memory array 162 can be accessible by one or more ports using port circuit 168. Also, access to third dimensional memory array 162 can be enhanced using priority circuit 170, which can resolve a port conflict when connected to port circuit 168. Priority circuit 170 selects the path for memory access and control block 166 provides the address for the priority selected port (e.g., input 1, input 2, . . . , input n) into or out of memory 162. In yet other examples, a port conflict can include multiple requests for a resource (e.g., an operation to compress an input, store an input, store a compressed input, read a file or a compressed file, or others). In other words, priority circuit 170 can prioritize requests according to one or more methods of arbitration (e.g., round-robin, priority command, or others). In some examples, controller 166 can use scatter-gather circuit 112 (FIG. 1A) to locate an input in third dimensional memory array 162. For example, an input (or portion thereof) can be stored in one or more memory locations within third dimensional memory array 162. Also, an input (or portion thereof) can be disjoined from another input, which can be mapped continuously (i.e., piecing together) using a process generated by scatter-gather circuit 112 (FIG. 1A). In other examples, controller 166 can access an input (or compressed copy of the input) in one or more memory layers of third dimensional memory array 162. Also, controller 166 can store a compressed copy of an input (or portion thereof) simultaneously (or substantially simultaneously) with storing the input. Further, controller 166 can store a compressed copy of an input simultaneously (or substantially simultaneously) with having the input compressed by processor 164. It should be noted that controller block 166 primarily acts as a complex DMA controller with special scatter gather registers. As a DMA controller it reads and writes to memory 162 based on the priority granted for a bidding port or processor. Typically the processor 164 will have highest access or be time multiplexed with the other ports. This will allow the processor 164 fast access to memory 162, which will allow for fast memory access in getting or storing data for a compress or decompress operation. In some examples, processor 164 can be controlled by a processor external to system 160. For example, a processor (e.g., a CPU, µP, or DSP) can connect to port circuit 168 and provide an instruction to processor 164. Also, the processor 164 can access a portion of third dimensional memory array 162 using a processor mailbox (not shown), which can provide information or data for the processor to use when granted access to system 160. In other examples, processor 164 can be connected to processor memory 172 to store data generated by processor 164. For example, processor 164 can generate data used for compressing an input from one or more ports. Also, processor memory 172 can store compressed data, authentication keys (i.e., encrypt the compressed data), and interim calculations from mathematical algorithms. Further, processor memory 172 can use a portion of third dimensional memory array 162 including one or more layers of memory. In still other examples, system 160 and the above-described elements (i.e., all elements shown and indicated by reference numerals above) can be implemented differently in design, operation, configuration, and architecture, and are not limited to the descriptions provided herein.

U.S. patent application Ser. No. 11/095,026, filed Mar. 30, 2005, entitled "Memory Using Mixed Valence Conductive Oxides," and published as U.S. Pub. No. US 2006/0171200 A1 on Aug. 3, 2006, is herein incorporated by reference in its entirety and for all purposes, and describes non-volatile third dimensional memory elements that may be arranged in a two-terminal, cross-point memory array. The memory elements can be a component of a memory cell that includes electrically in series with the memory element, other structures including but not limited to a non-ohmic device (NOD) and electrodes. New non-volatile memory structures are possible with the capability of this third dimensional memory array. The technology allows for the emulation of other memory technologies by duplicating the interface signals and protocols, while accessing the third dimensional memory array. The third dimensional memory array may emulate other types of memory (e.g., DRAM, SRAM, FLASH, and ROM), providing memory combinations (e.g., DRAM, FLASH, and SRAM) within a single component. In at least some embodiments, a two-terminal memory cell can be configured to change conductivity when exposed to an appropriate voltage drop across the two-terminals. The memory cell can include an electrolytic tunnel barrier and a conductive metal oxide (CMO), such as a mixed valence conductive oxide (e.g., a memory element) in some embodiments, as well as multiple mixed valence conductive oxide structures in other embodiments. A voltage drop across the electrolytic tunnel barrier can cause an electrical field within the mixed valence conductive oxide that is strong enough to move oxygen ions out of the mixed valence conductive oxide, according to some embodiments.

In some embodiments, an electrolytic tunnel barrier and one or more mixed valence conductive oxide structures do not need to operate in a silicon substrate, and, therefore, can be fabricated (e.g., back-end-of-the-line BEOL) above circuitry being used for other purposes (e.g., circuitry fabricated front-end-of-the-line FEOL). The circuitry portion of an IC can be fabricated FEOL on a substrate (e.g., a silicon Si wafer) that is partitioned into die with each die forming the base structure for the IC. After the FEOL processing is completed the substrate is processed BEOL to fabricate the one or more layers of memory directly on top of each FEOL die. An inter-level interconnect structure formed FEOL serves as the structural and electrical foundation for the subsequent formation of the one or more layers of memory that will be deposited (e.g., formed) on top of the FEOL die. The inter-level interconnect structure includes vias, plugs, damascene structures or the like, that allow the FEOL circuitry to be electrically coupled with the BEOL memory layer(s). After BEOL processing is completed, the finished die can be singulated from the substrate (e.g., removed by sawing or cutting) to form individual die that can be inserted into a suitable package and electrically coupled with bonding pads or other structures in the package to form an integrated circuit (IC). Therefore, each die is an integral unit that includes at a bottommost layer the FEOL circuitry and upper layers comprised of one or more layers of third dimensional memory that are positioned above the FEOL circuitry layer. Unlike conventional IC's that have conventional memory (e.g., SRAM, DRAM, and FLASH) fabricated FEOL on the same substrate die as the circuitry that accesses the memory such that the memory and the circuitry are disposed on the same physical plane, the BEOL third dimensional memory layer(s) are not on the same plane as the FEOL circuitry and therefore do not take up area on the FEOL die. Accordingly, data storage can be increased without increasing the area of the FEOL die by fabricating additional BEOL memory layers on top of the FEOL die (e.g., along the +Z axis of FIGS. 7B-8C).

Further, a two-terminal memory cell can be arranged in a cross-point configuration such that one terminal is electrically coupled with an X-direction line (or an "X-line") and the other terminal is electrically coupled with a Y-direction line (or a "Y-line"). A third dimensional memory can include multiple memory cells vertically stacked upon one another, sometimes sharing X-direction and Y-direction lines in a layer of memory, and sometimes having electrically isolated X and Y direction lines (e.g., using a dielectric material such as $SiO_2$). When a first write voltage, VW1, is applied across the memory cell (e.g., by applying ½ VW1 to the X-direction line and ½-VW1 to the Y-direction line), the memory cell can switch to a low resistive state. When a second write voltage, VW2, is applied across the memory cell (e.g., by applying ½ VW2 to the X-direction line and ½-VW2 to the Y-direction line), the memory cell can switch to a high resistive state. Memory cells using electrolytic tunnel barriers and mixed valence conductive oxides can have VW1 opposite in polarity from VW2. The optional NOD is operative to substantially block current flow through the memory cells that are half-selected or un-selected, that is for memory cells that do not have a read voltage or a write voltage applied across their terminals.

Figure 2:
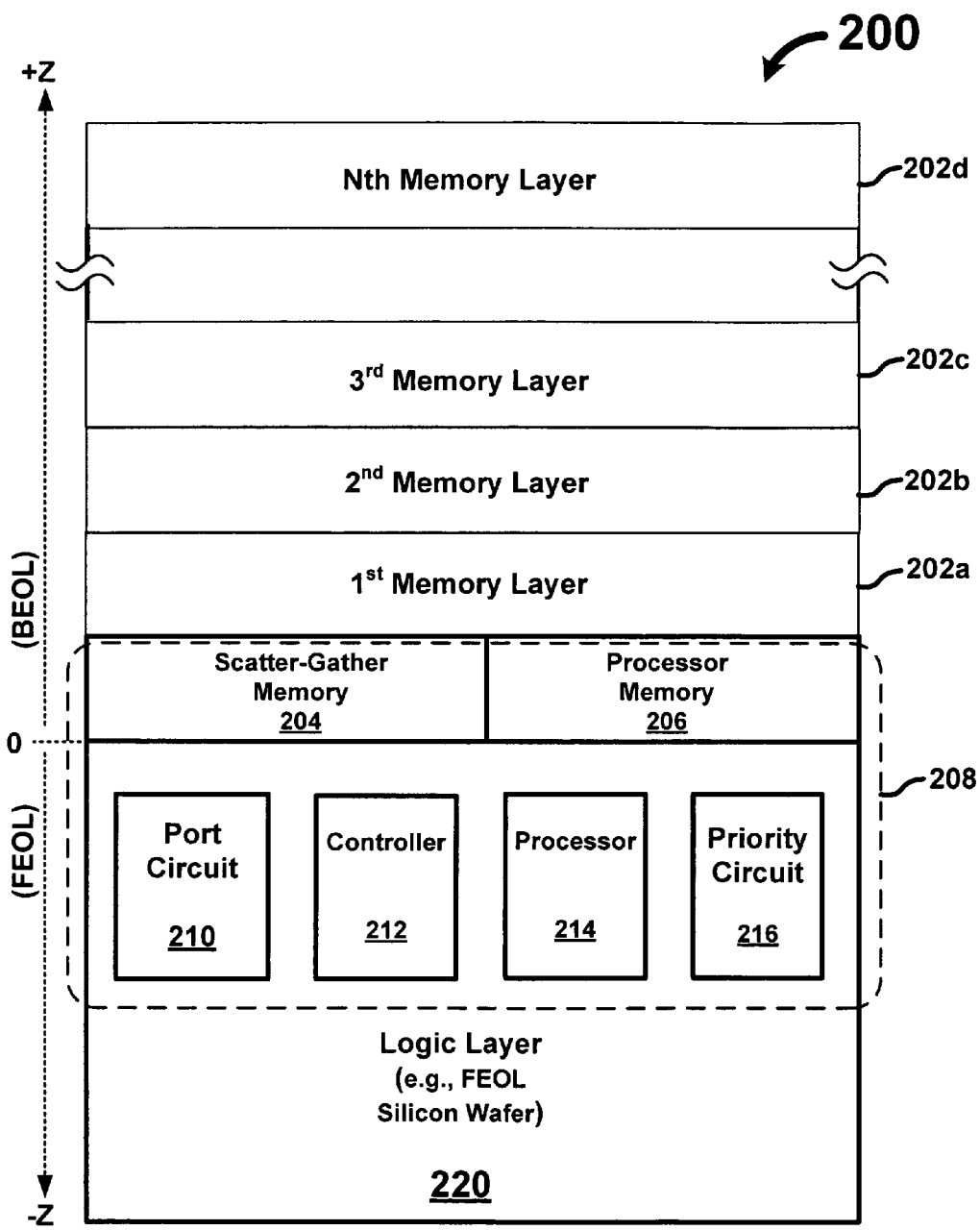
FIG. 2 depicts a cross-sectional view of an exemplary integrated circuit implementing a third dimensional memory with compression engine.

FIG. 2 depicts a cross-sectional view of an exemplary integrated circuit implementing a third dimensional memory with compression engine. Here, cross-sectional view 200 includes memory layers 202, scatter-gather memory 204, processor memory 206, compression engine 208, port circuit 210, controller 212, processor 214, priority circuit 216, and logic layer 220. Here, a portion of the compress engine 208 comprises one or more BEOL memory layers or planes (e.g., 204 and 206) and another portion comprises FEOL circuitry (e.g., 210, 212, 214, and 216) in the FEOL logic layer 220. Cross-sectional view 200 shows multiple layers of BEOL memory being vertically disposed above or on FEOL logic layer 220. In some examples, logic layer 220 includes logic used for compressing an input, and a semiconductor substrate (e.g., a silicon—Si wafer) upon which the logic can be formed FEOL. In some examples, port circuit 210 can include logic to buffer a wide data interface from port circuit 168 (FIG. 1B) and BEOL third dimensional memory array 162 (FIG. 1B). For example, FEOL logic layer 220 can include logic used by port circuit 210 to buffer an input to one or more of BEOL memory layers 202. Typically a size of the BEOL buffer memory is small and is made big enough to prevent buffer over run or under run with all ports active. In other examples, logic layer 220 can include logic used by controller 212 to provide control of an access to third dimensional memory array 162 (FIG. 1B). Also, logic layer 220 can include logic to form scatter-gather circuit 112 (FIG. 1A), which can locate an input (or compressed copy of the input) in one or more of memory layers 202. Further, scatter-gather circuit 112 (FIG. 1A) can store information of a location to an input in one or more of memory layers 202 using scatter-gather memory 204. For example, scatter-gather memory 204 can store a pointer, an offset, or a look-up table using a portion of third dimensional memory array 102 (FIG. 1A). In still other examples, logic layer 220 can include logic to form processor 214, which can compress an input using processor memory 206 used to store interim calculations, compressed data, and authentication keys. Also, processor memory 206 can be formed using one or more of memory layers 202 (or portion thereof). In yet other examples, logic layer 220 can include logic to form priority circuit 216 to resolve a request from more than one port to access one or more of memory layers 202. In other words, priority circuit 216 can arbitrate between more than one request, and provide information to controller 212 to grant access to third dimensional memory array 102 (FIG. 1A).

In some examples, BEOL third dimensional memory array 102 (FIG. 1A) can be formed in cross-sectional view 200 using BEOL memory layers 202 to store an input (or compressed copy of the input). In other examples, an input can be stored in memory in non-successive locations of memory layers 202. For example, a portion of an input can be stored in a location not bordering another portion of an input. In still other examples, an input can be stored adjacent to another input stored in memory layers 202. In some examples, one or more of memory layers 202 can be mapped by a range of memory locations to determine a boundary used by scatter-gather circuit 112 (FIG. 1A) to locate an input. For example, an input can be stored in memory layer 202a and memory layer 202b, which can be accessible by compression engine 208. In other examples, nth main memory layer 202d can be formed to include third dimensional memory for an nth array. In still other examples, cross-sectional view 200 and the above-described elements (i.e., all elements shown and indicated by reference numerals above) can be implemented differently in design, operation, configuration, and architecture, and are not limited to the descriptions provided herein.

Figure 3A:
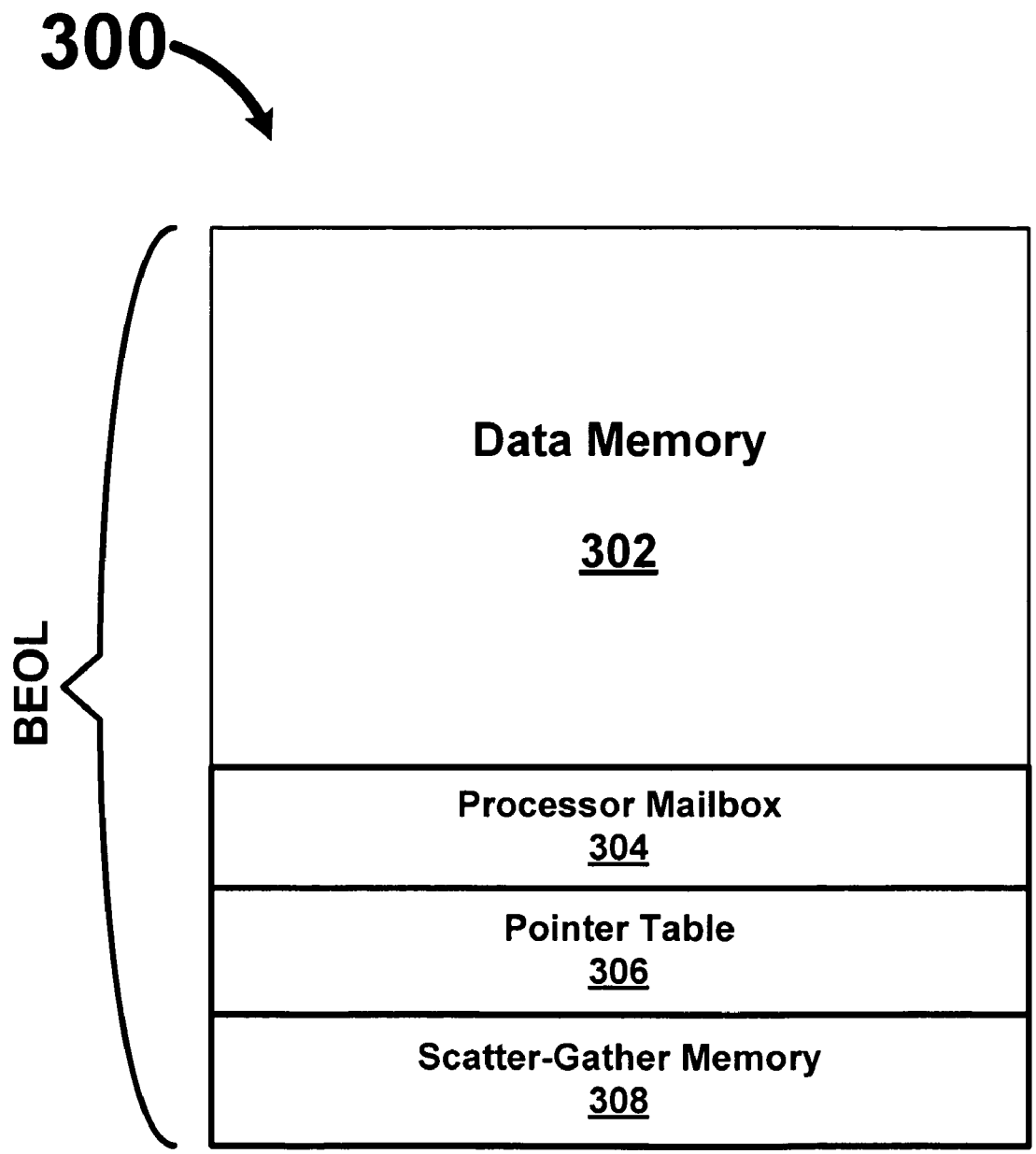
FIG. 3A depicts a cross-sectional view of an exemplary third dimensional memory with compression engine.

FIG. 3A depicts a cross-sectional view of an exemplary BEOL third dimensional memory with compression engine. Here, cross-sectional view 300 can be configured to include data memory 302, processor mailbox 304, pointer table 306, and scatter-gather memory 308. In some examples, BEOL third dimensional memory array 102 (FIG. 1A) can be configured for storing an input and a compressed copy of the input on a common layer. In other examples, an input can be stored on a different layer from a compressed copy of the input. Further, data memory 302 can be configured for storing an input and a compressed copy of the input using one or more layers of third dimensional memory array 102 (FIG. 1A). Still further, data memory 302 can be formed in a portion of third dimensional memory array 102 (FIG. 1A) bordering another portion having one or more layers storing data used by controller 110 (FIG. 1A) and processor 114 (FIG. 1A). In some examples, processor 164 (FIG. 1B) can be controlled by one or more processors external to system 160 (FIG. 1B) by connecting to port circuit 168 (FIG. 1B). In other examples, a processor (e.g., CPU) can use information or data stored in processor mailbox 304 to control processor 164 (FIG. 1B). For example, processor mailbox 304 can include program settings for a processor to be identified by controller 110 (FIG. 1B) to access processor 164 (FIG. 1B). In some examples, a controller can store information or data of a memory location indicating an input being stored in data memory 302. For example, a resource (e.g., a controller, a processor, or others) of system 160 (FIG. 1B) can access pointer table 306 to use a starting address to locate a memory location storing an input (or compressed copy of the input). In other words, a processor can use a starting address to point to a memory location, offset to an address from the starting address, or jump to the memory location from another memory location using information or data from pointer table 306. In some examples, controller 166 (FIG. 1B) can use a process (i.e., operations by scatter-gather circuit 112 (FIG. 1A)) to locate an input (or compressed copy of the input) stored in picture memory 302. For example, scatter-gather memory 308 can store information or data having one or more pointers to locate an input (or compressed copy of the input) in third dimensional memory array 102 (FIG. 1A). In other examples, a pointer can include a port address identifying a source of an input using port circuit 168 (FIG. 1B). In still other examples, a pointer can identify a command for controller 166 (FIG. 1B) to use, in connection with, scatter-gather circuit 112 (FIG. 1A). In yet other examples, a pointer can identify an address to a memory location in data memory 302 storing an input (or a compressed copy of the input). Also, a pointer can identify a transfer count to provide a range of addresses storing an input (or a compressed copy of the input). Further, a pointer can identify a marker providing information of one or more additional memory locations storing an input (or a compressed copy of the input). Still further, a marker can provide information for controller 166 (FIG. 1B) to end operations locating an input (or a compressed copy of the input). In some examples, one or more layers of memory (or portion thereof) can be formed to store information or data using memories of cross-sectional view 300. In other examples, cross-sectional view 300 and the above-described elements (i.e., all elements shown and indicated by reference numerals above) can be implemented differently in design, operation, configuration, and architecture, and are not limited to the descriptions provided herein.

Figure 3B:
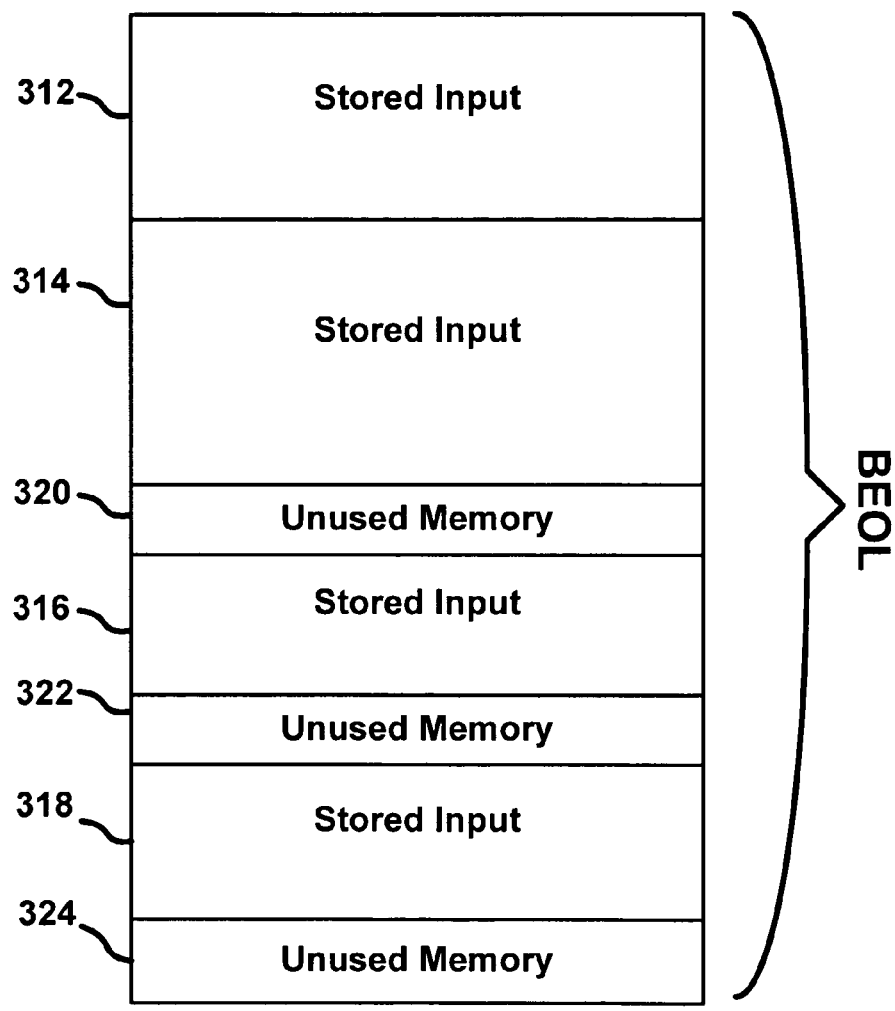
FIG. 3B depicts a cross-sectional view of an alternative exemplary third dimensional memory with compression engine.

FIG. 3B depicts a cross-sectional view of an alternative exemplary BEOL third dimensional memory with compression engine. Here, cross-sectional view 310 can be configured to include stored inputs 312, 314, 316, and 318 and unused memory 320, 322, and 324. In some examples, one or more memory locations can be configured for storing an input using third dimensional memory array 102 (FIG. 1A). For example, an input can be received by port circuit 116 (FIG. 1A) from a source (e.g., charge-coupled device (CCD), ADC, or others) to store and compress. In other examples, an input received by system 100 (FIG. 1A) can be stored in intermittent periods of time from analog sources (e.g., CCD), which can produce gaps in memory (e.g., unused memory 320-324). In other words, an input can be stored in memory following (or substantially following) a request from an analog source, which can produce an input temporally independent of another input. In some examples, cross-sectional view 310 can be formed using one or more layers (or portion thereof) of third dimensional memory array 102 (FIG. 1A). In other examples, one or more layers of cross-sectional view 310 can be accessed independently of one or more other memory layers of third dimensional memory array 102 (FIG. 1A). In still other examples, cross-sectional view 310 and the above-described elements (i.e., all elements shown and indicated by reference numerals above) can be implemented differently in design, operation, configuration, and architecture, and are not limited to the descriptions provided herein.

FIG. 3B shows an example of file storage that typically could be seen in usage. When a picture is taken the data will be stored in memory as an uncompressed file. The processor then compresses the picture file just stored and stores it at another memory location. The uncompressed file is then no longer needed and its memory location is put back in use. By storing and removing files of different size the memory gets fragmented and the need for scatter gather methods is required. New files are stored in areas that are not reserved.

Figure 3C:
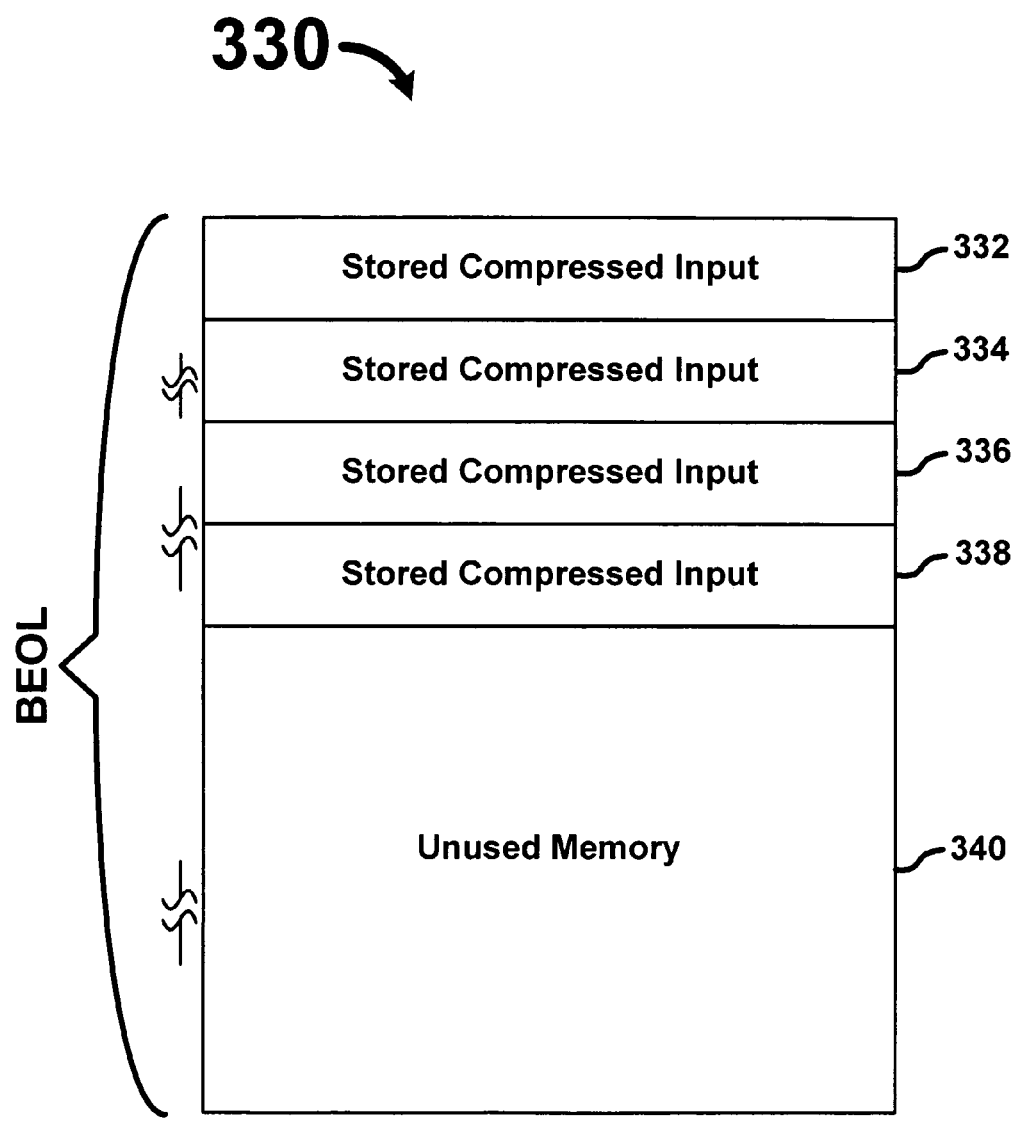
FIG. 3C depicts a cross-sectional view of still another exemplary third dimensional memory with compression engine.

FIG. 3C depicts a cross-sectional view of still another exemplary third dimensional memory with compression engine. Here, cross-sectional view 330 can be configured to include stored compressed inputs 332-338 and unused memory 340. In some examples, an input can be compressed by processor 114 (FIG. 1A) to form a compressed data. As used herein, the term "compressed data" refers generally, to one or more units of data after being compressed by processor 114 (FIG. 1A). For example, a compressed data can be stored in third dimensional memory array 102 (FIG. 1A) using one or more layers of memory. In other words, a layer of memory can store a compressed data (or portion thereof or multiple compressed files) to form one or more of stored compressed inputs 332-338. In other examples, a stored compressed input (e.g., one or more of stored compressed inputs 332-338) can be configured for bordering another stored compressed input using successive memory locations in third dimensional memory array 102 (FIG. 1A). In still other examples, a compressed data can replace an input previously stored in one or more of stored inputs 312-318 (FIG. 3B). In other words, a portion of third dimensional memory array 102 (FIG. 1A) storing an input can be replaced by a compressed data (or portion thereof). In yet other examples, a compressed data can be stored in a memory location separate from an input. For example, a compressed data (or portion thereof) can be stored on a common layer with an input. In another example, a compressed data (or portion thereof) can be stored on a separate layer from an input. Further, third dimensional memory array 102 (FIG. 1A) can provide storage for a compressed data using one or more layers of memory, which can provide one or more memory locations not storing a compressed data, and forming unused memory 340. In still other examples, cross-sectional view 330 and the above-described elements (i.e., all elements shown and indicated by reference numerals above) can be implemented differently in design, operation, configuration, and architecture, and are not limited to the descriptions provided herein.

Figure 4:
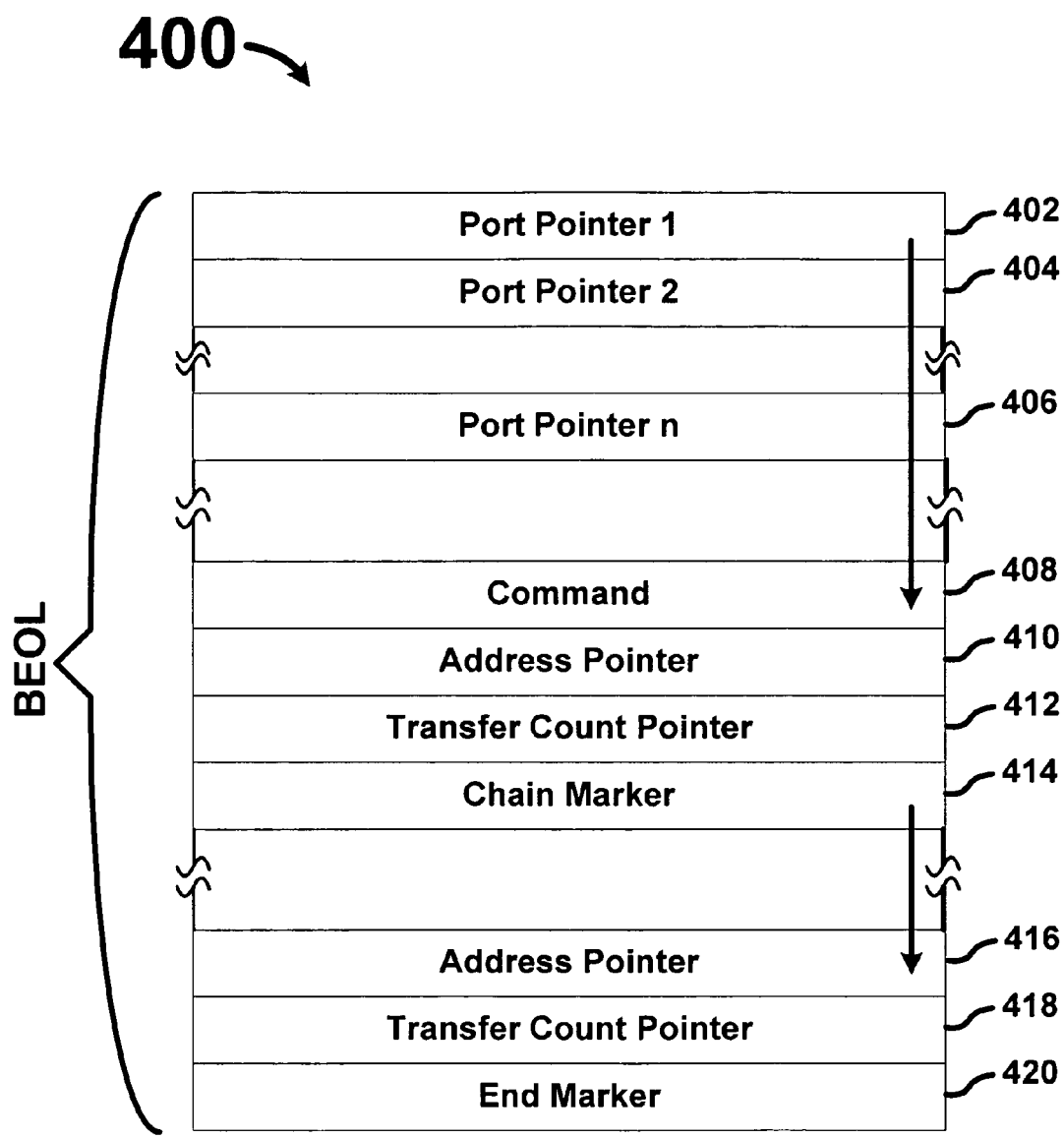
FIG. 4 depicts a cross-sectional view of an exemplary scatter-gather memory.

FIG. 4 depicts a cross-sectional view of an exemplary scatter-gather memory. Here, BEOL memory 400 includes port pointers 402-406, command 408, address pointer 410, transfer count pointer 412, chain marker 414, address pointer 416, transfer count pointer 418, and end marker 420. In some examples, memory 400 can include port pointers 402-406 to identify a port connected to a source (e.g., analog or digital), and locate an input (or a compressed copy of the input) in third dimensional memory array 102 (FIG. 1A). For example, port pointer 402 can locate a chain of pointers (e.g., command 408, address pointer 410, transfer count pointer 412, chain marker 414, or others) used to identify a memory location in third dimensional memory array 102 (FIG. 1A) storing an input (or a compressed copy of the input). In other examples, port pointer 402 can include a start bit to identify a starting address of a chain of pointers. In some examples, command 408 can provide a port associated with port pointer 402 with an instruction to perform a read or write using third dimensional memory array 102 (FIG. 1A). For example, a command can include writing to third dimensional memory array 102 (FIG. 1A) using an input (or a compressed copy of the input). In another example, a command can include reading from third dimensional memory array 102 (FIG. 1A) to retrieve an input (or a compressed copy of the input). In other examples, address pointer 410 can provide a starting address to a memory location storing an input (or a compressed copy of the input). In still other examples, scatter-gather memory 112 can store information or data to memory 400 with a memory location following (or immediately following) storage of an input (or a compressed copy of the input). In yet other examples, transfer count 412 can provide a range of memory locations (i.e., size of data) storing an input (or a compressed copy of the input). In some examples, chain marker 414 can identify continuation from a starting address to another range of memory locations storing an input (or a compressed copy of the input). For example, address pointer 416 can provide another starting address continuing from a starting address identified by chain marker 414. Also, transfer count pointer 418 can provide a range of memory locations from another starting address to continue locating an input (or a compressed copy of the input) as identified by starting address 416. In other examples, end marker 420 can identify an ending point to a range of memory locations including continuation from another range of memory locations storing an input (or a compressed copy of the input). For example, an ending point can be identified by one or more data positions (e.g., a most significant bit (MSB)) having a logical value associated with setting the ending point (e.g., positive voltage, +V). In some examples, memory 400 and the above-described elements (i.e., all elements shown and indicated by reference numerals above) can be implemented differently in design, operation, configuration, and architecture, and are not limited to the descriptions provided herein. In the pointer system described the address pointer tells where data is to be read or written, the transfer count pointer 412 tells how many locations to store from the starting address. The chain marker 414 tells if there is more data to be accessed, and if, so where to go for the next starting address pointer. The same sequences repeat until the end marker 420 is reached.

Figure 5:
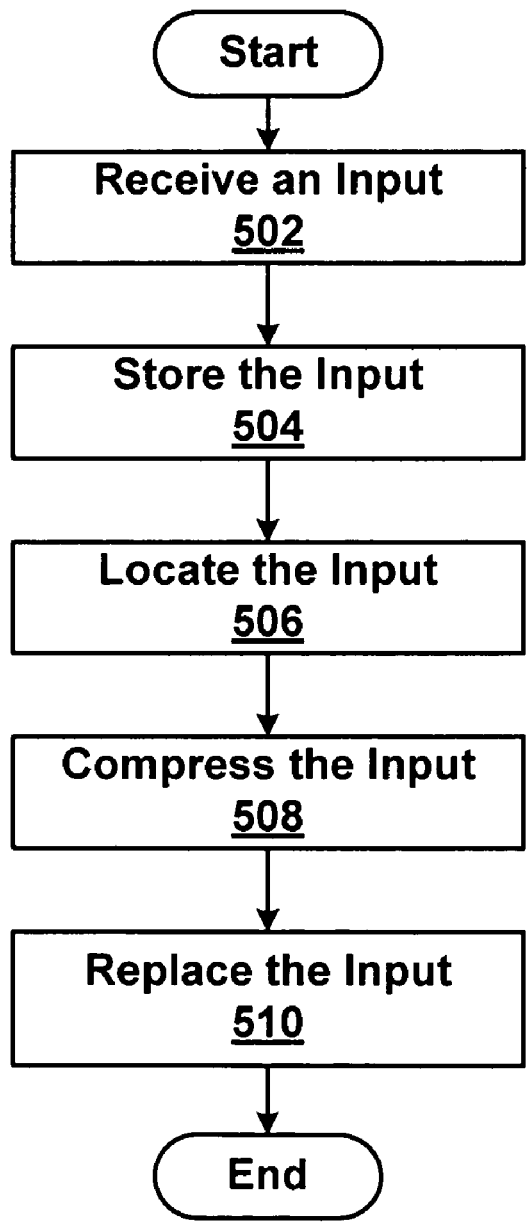
FIG. 5 depicts an exemplary process of a third dimensional memory with compression engine.

FIG. 5 depicts an exemplary process of a third dimensional memory with compression engine. Here, process 500 begins by having port circuit 116 (FIG. 1A) receive an input independent of another input (at a stage 502). In some examples, port circuit 116 (FIG. 1A) can receive an input from more than one source connected to a port requesting access to BEOL third dimensional memory array 102 (FIG. 1A). In other examples, controller 110 (FIG. 1A) can store an input into a portion of third dimensional memory array 102 (FIG. 1A) (at a stage 504). For example, an input can be stored by third dimensional memory array 102 (FIG. 1A) to provide to processor 114 (FIG. 1A) for compressing. In still other examples, controller 110 (FIG. 1A) can use scatter-gather circuit 112 (FIG. 1A) to locate an input in third dimensional memory array 102 (FIG. 1A) (at a stage 506). For example, scatter-gather circuit 112 (FIG. 1A) can use a process including storing one or more pointers identifying information or data of a memory location storing an input (or a compressed copy of the input). In yet other examples, an input can be located by scatter-gather circuit 112 (FIG. 1A) and forwarded to processor 114 (FIG. 1A) for compressing the input to form a compressed copy of the input (at a stage 508). Further, controller 110 (FIG. 1A) can replace an input stored in third dimensional memory array 102 (FIG. 1A) with a compressed copy of the input (at a stage 510). Still further, controller 110 (FIG. 1A) can store a compressed copy of an input in a different memory location from the input. In some examples, the above-described process can be varied in implementation, order, execution, or operation, and is not limited to the examples provided above. If a compressed file is to be read the compressed data will be sent to the processor for decompression. The decompressed data will then be sent to the requesting port.

Figure 6:
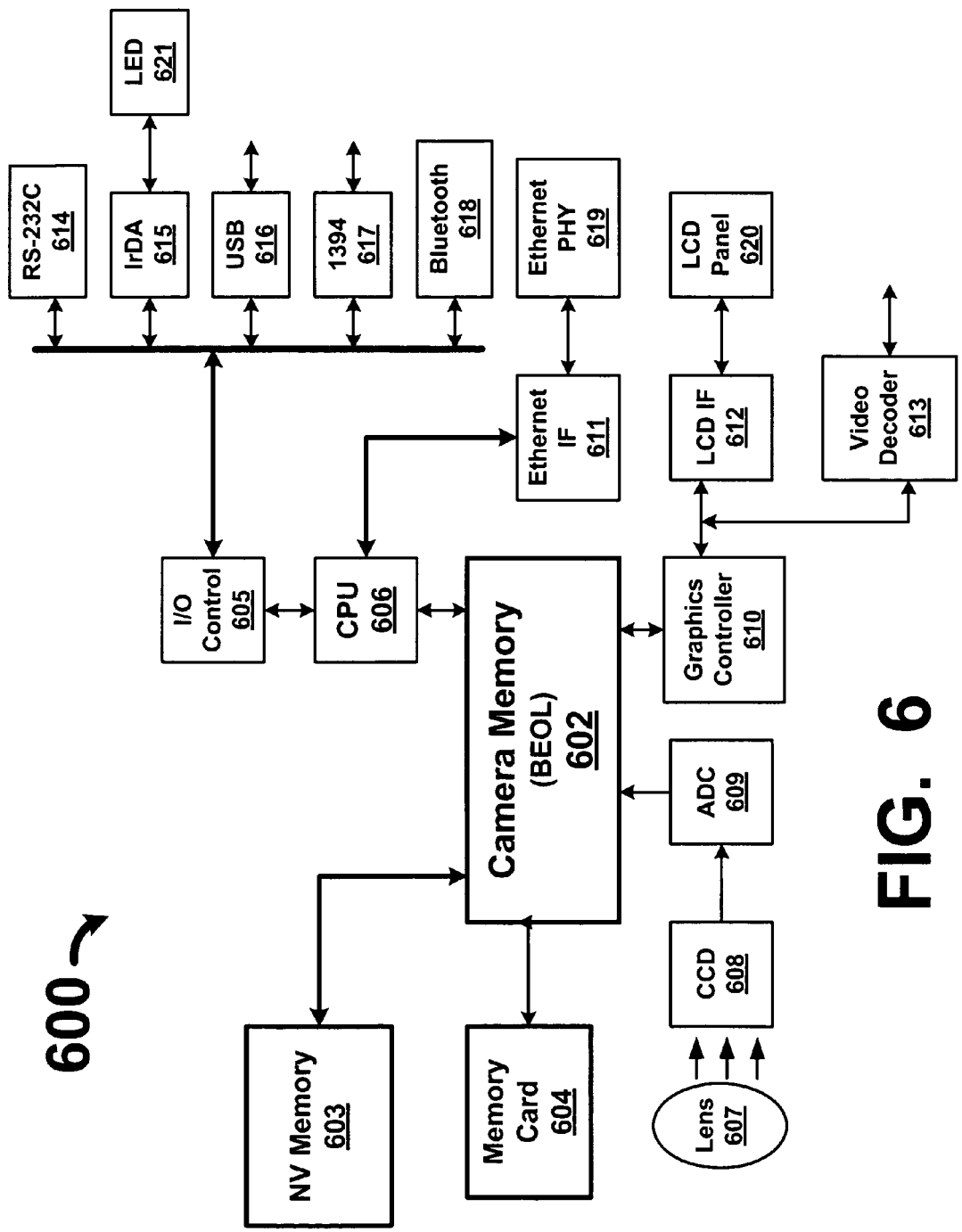
FIG. 6 depicts an alternative exemplary implementation of a third dimensional memory with compression engine.

FIG. 6 depicts an alternative exemplary implementation of a third dimensional memory with compression engine. Here, implementation 600 includes camera memory 602 (e.g., a BEOL third dimensional memory array(s)), non-volatile (NV) memory 603, memory card 604, input-output (I/O) control 605, CPU 606, lens 607, CCD 608, ADC 609, graphics controller 610, Ethernet interface 611, liquid-crystal display interface (LCD IF) 612, video decoder 613, serial port (RS-232C) 614, infrared data (IrDA) 615, universal serial bus (USB) 616, IEEE 1394 617, Bluetooth interface (IF) 618, Ethernet physical layer (PHY) 619, LCD panel 620, and light-emitting diode (LED) 621. Optionally, memory card 604 and/or NV memory 603 can also be configured as BEOL third dimensional memory array(s). In some examples, camera 602 can be configured for storing and compressing an input from one or more sources (e.g., CCD, LCD, CPU, or others) of implementation 600. In other examples, implementation 600 can be configured for interfacing with one or more sources providing imaging, including transfer of data using one or more interfaces (e.g., serial, infrared, IEEE 1394, Bluetooth, Ethernet, or others). In some examples, implementation 600 and the above-described elements (i.e., all elements shown and indicated by reference numerals above) can be implemented differently in design, operation, configuration, and architecture, and are not limited to the descriptions provided herein.

Figure 7A:
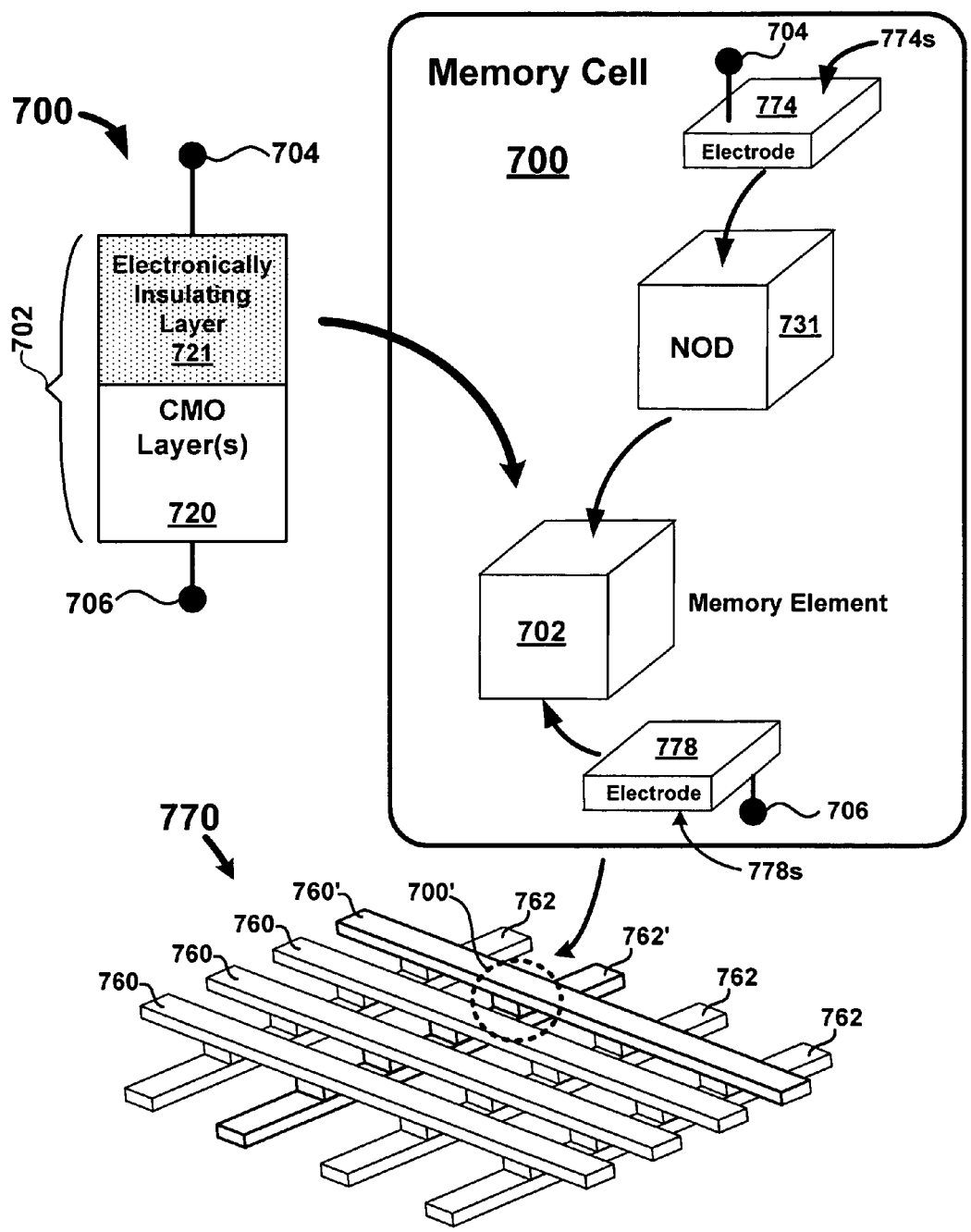
FIG. 7A depicts an example of memory cells positioned in a two-terminal cross-point array.

FIG. 7A depicts an example of arrayed memory cells according to various embodiments of the invention. In this example, a memory cell 700 includes a memory element 702 and NOD 731 positioned above or below (not shown) the memory element 702. The NOD 731 is optional and some configurations of the memory cell 700 will not use the NOD 731. The memory element 702 can include the above mentioned CMO layer(s) and electronically insulating layer (e.g., a thin film layer YSZ having a thickness of approximately 50 Å or less) denoted as 720 and 721 respectively. The layers 720 and 721 can be discrete layers as depicted or they can be continuous and un-etched layers (not shown). Memory cell 700 further includes terminals 704 and 706 with the memory element 702 electrically in series with the terminals (704, 706). Terminals 704 and 706 can be electrically coupled with or can be formed as electrodes 774 and 778. The electrodes (774, 778) can be made from an electrically conductive material including, but not limited to, platinum (Pt), gold (Au), silver (Ag), iridium (Ir), iridium oxide (IrO$_x$), ruthenium (Ru), palladium (Pd), aluminum (Al), alloys of those materials, and the like. The electrodes (774, 778) can be in contact with and/or electrically coupled with conductive array lines operative to apply the aforementioned voltages for data operations, such as read voltages and write voltages (e.g., program and erase voltages) across one or more selected memory cells 700. The memory element 702 and NOD 731 are electrically in series with each other and electrically in series with the electrodes (774, 778).

Memory cell 700 can be formed between conductive array lines, such as array lines 762 and 760. Thus, memory cell 700 can be formed in an array of other memory cells 700. In FIG. 7A, array lines 762' and 760' are depicted in heavy line to illustrate that those array lines have voltages for data operations applied to them such that memory cell 700' is the selected memory cell for the data operation. The array can be a cross-point array 770 including groups of conductive array lines 760 and 762. For example, array lines 760 can be electrically coupled with the electrodes 774 of the memory cells 700 and/or may be in contact with a surface 774s of the electrodes 774, and array lines 762 can be electrically coupled with the electrodes 778 of the memory cells 700 and/or may be in contact with a surface 778s of the electrodes 778. Although not depicted in FIG. 7A, the active circuitry that applies the voltages for data operations is positioned below the array 770 on a substrate (e.g., FEOL logic layer 106 or 220) with the array 770 fabricated directly on top of the substrate and the array 770 in contact with the substrate.

Figure 7B:
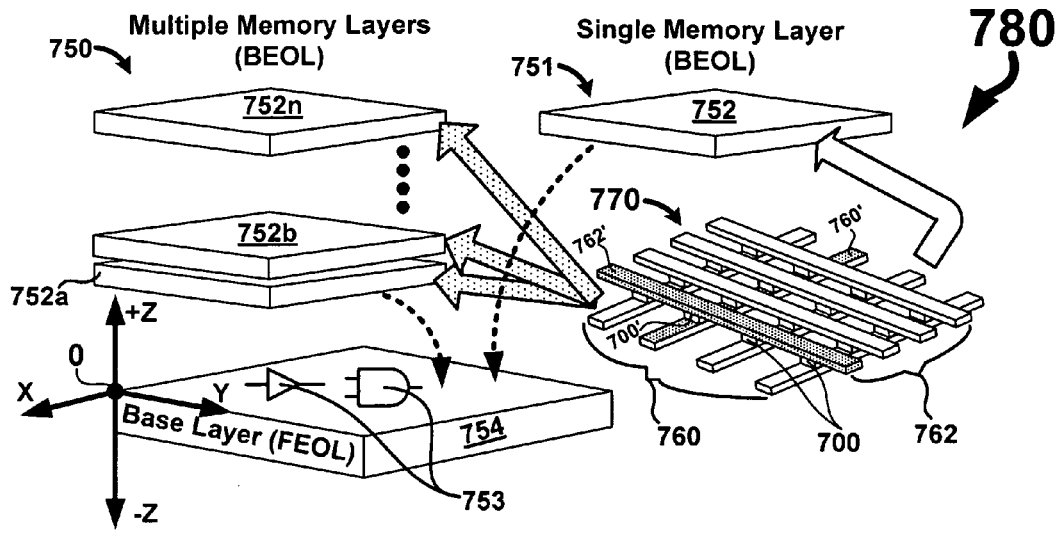
FIG. 7B depicts a single layer or multiple vertically stacked layers of memory arrays formed BEOL on top of a base layer die including circuitry formed FEOL.

FIG. 7B depicts an integrated circuit including memory cells disposed in a single layer or in multiple layers of memory, according to various embodiments of the invention. In this example, integrated circuit 780 is shown to include either multiple layers 750 of memory (e.g., layers 752a, 752b, . . . 752n) or a single memory layer 751 (e.g., layer 752) formed on a base layer 754 with the base layer 754 serving as the logic layer (e.g., logic layers 106 or 220) for the array(s) fabricated above it. As will be described in greater detail below, the layers 754 and 752a, 752b, . . . 752n or layers 754 and 752 are not physically separate layers as depicted in FIG. 7B for purposes of illustration, rather they are different portions of a unitary die 800 (not shown) comprised of a FEOL portion for the base layer 754 and a BEOL portion for the layer 752 or layers 752a, 752b, . . . 752n. In at least some embodiments, each layer (e.g., layer 752 or layers 752a, 752b, . . . 752n) of memory can be a cross-point memory array 770 including conductive array lines 760 and 762 arranged in different directions (e.g., orthogonal to each other) to access re-writable memory cells 700 such as two-terminal memory cells as described above. Layer 752 or layers 752a, 752b, . . . 752n can be used to implement the above mentioned memory planes/layers, scatter-gather memory, processor memory, data memory, processor mailbox, pointer table, and the like. Examples of conductive array lines include X-line conductive array lines (e.g., 760) and Y-line conductive array lines (e.g., 762). The X and Y conductive array lines are sometimes referred to as row lines and column lines respectively. Base layer 754 can include a bulk semiconductor substrate (e.g., a silicon wafer) upon which memory access circuits 753 for performing data operations (e.g., read operations and write operations including the writing copy data) on the memory cells 700 in memory 750 or 751 are fabricated. Base layer 754 may include other circuitry that may or may not be related to data operations on memory. Base layer 754 and circuitry 753 (e.g., CMOS active circuitry such as decoders, drivers, sense amps, buffer, registers, scatter-gather circuit, port circuit, controller, priority circuit, processor, etc.) can be formed in a front-end-of-the-line (FEOL) fabrication process and multiple memory layers 750 or single memory layer 751 can be formed in a back-end-of-the-line (BEOL) fabrication process tailored to fabricating layer(s) of memory arrays on top of the base layer 754. Although not depicted, the base layer 754 can include an inter-level interconnect structure configured to include nodes (e.g., openings in a dielectric material or electrically conductive structures such as vias, plugs, thrus, damascene structures, etc.) for facilitating electrical coupling between the circuitry 753 and the conductive array lines (760, 762) of the array(s) so that signals (e.g., read and write voltages) for data operations (e.g., read and write operations) are electrically communicated between the array(s) and the circuitry 753. The inter-level interconnect structure can be one of the last microelectronic structures fabricated during the FEOL processing.

Figure 7C:
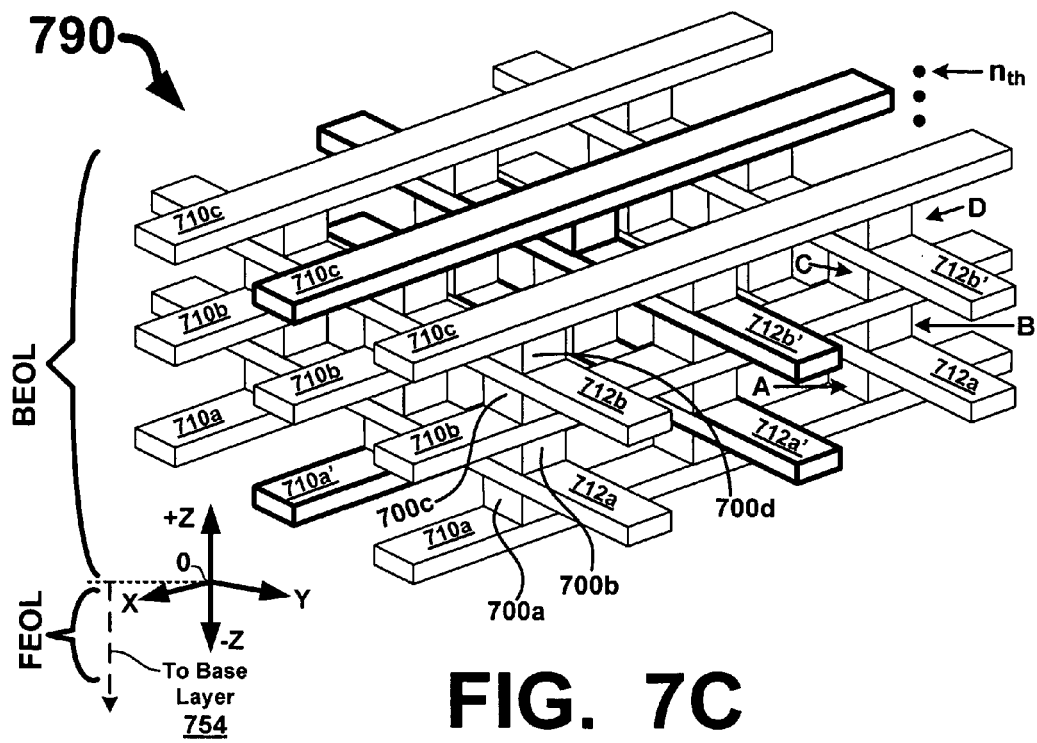
FIG. 7C depicts one example of a vertically stacked memory including multiple array layers that share conductive array lines and formed BEOL directly on top of a previously formed FEOL base layer.

Moving on to FIG. 7C, where a vertically stacked array 790 includes a plurality of memory layers A,B,C, and D with each memory layer including memory cells 700a, 700b, 700c, and 700d. Although only four layers are depicted, the array 790 can include fewer layers or can include additional layers up to an nth layer. The array 790 includes three levels of x-direction conductive array lines 710a, 710b, and 710c, and two levels of y-direction conductive array lines 712a, and 712b. Unlike the configuration for array 770 in FIG. 7A, the memory cells 700a, 700b, 700c, and 700d depicted in FIG. 7C share conductive array lines with other memory cells that are positioned above, below, or both above and below that memory cell. The conductive array lines, the memory cells, dielectric materials that electrically isolate structures in the array 790 (not shown), and other structures in the array 790 are formed BEOL above the base layer 754 (not shown) as indicated by +Z on the Z-axis above the dashed line at origin 0; whereas, the active circuitry for performing data operations on the array 790 and the interconnect structure for electrically coupling the active circuitry with the array 790 (e.g., the conductive array lines) are previously formed FEOL as indicated by −Z on the Z-axis below the dashed line at origin 0. Accordingly, the BEOL structure for array 790 is formed on top of the FEOL structure for base layer 754 with the order of fabrication going in a direction from −Z (i.e., FEOL) to +Z (i.e., BEOL) along the Z-axis.

Figure 8A:
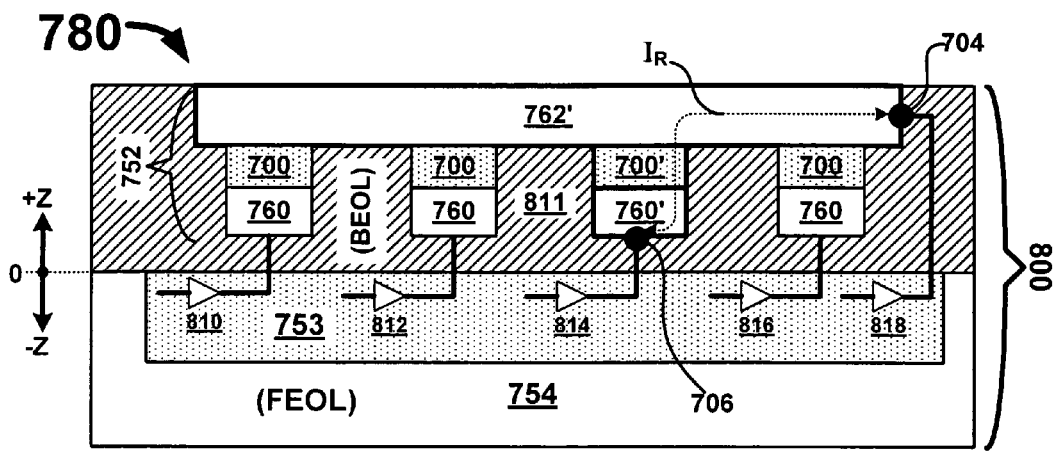
FIG. 8A depicts a cross-sectional view of an integrated circuit die including a single layer of memory fabricated over a substrate including active circuitry fabricated on the substrate in a logic layer.

Reference is now made to FIG. 8A, where integrated circuit 780 includes the base layer 754 and active circuitry 753 fabricated on the base layer 754 (e.g., a silicon Si wafer). The integrated circuit 780 is comprised of a single unitary die 800 having a first portion (i.e., the base layer 754) fabricated first using FEOL processing and a second portion (i.e., the single memory layer 752) fabricated second and formed directly on top of the base layer 754 using BEOL processing, such that the second portion is integrally formed with the first portion and completes the formation of the die 800. As one example, the base layer 754 can be a silicon (Si) wafer and the active circuitry 753 can be microelectronic devices formed on the base layer 754 using a CMOS fabrication process. The memory cells 700 and their respective conductive array lines (760, 762) can be fabricated on top of the active circuitry 754 in the base layer 754. Those skilled in the art will appreciate that an inter-level interconnect structure (not shown) can electrically couple the conductive array lines (760, 762) with the active circuitry 753 which may include several metal layers. For example, vias can be used to electrically couple the conductive array lines (760, 762) with the active circuitry 753. The active circuitry 753 may include but is not limited to address decoders, sense amps, memory controllers, data buffers, direct memory access (DMA) circuits, voltage sources for generating the read and write voltages, port circuits, scatter-gather circuits, controllers, processors, priority circuits, just to name a few. Active circuits 810-818 can be configured to apply the select voltage potentials (e.g., read and write voltage potentials) to selected conductive array lines (760', 762'). Moreover, the active circuitry 753 may be electrically coupled with the conductive array lines (760', 762') to sense a read current $I_R$ that flows through selected memory cells 700' during a read operation and the read current $I_R$ can be sensed and processed by the active circuitry 753 to determine the conductivity profiles (e.g., the resistive state) of the selected memory cells 300'. Examples of conductivity profiles include but are not limited to a programmed conductivity profile written to a memory cell 700' during a programming data operation and an erased conductivity profile written to a memory cell 700' during an erase data operation. Memory cells 700 can store data as a plurality of conductivity profiles that can include the programmed or erased conductivity profiles only (e.g., only 1-Bit of data stored per memory cell 700) or more than two conductivity profiles for storing multiple bits of data per memory cell 700 (e.g., two or more bits of data per memory cell 700). The direction of current flow for the read current $I_R$ will depend on a magnitude and polarity of a read voltage applied across terminals 704 and 706. In some applications, it may be desirable to prevent un-selected array lines (760, 762) from floating. The active circuits 753 can be configured to apply an un-select voltage potential (e.g., approximately a ground potential) to the un-selected array lines (760, 762). A dielectric material 811 (e.g., $SiO_2$) may be used where necessary to provide electrical insulation between elements of the integrated circuit 780.

Figure 8B:
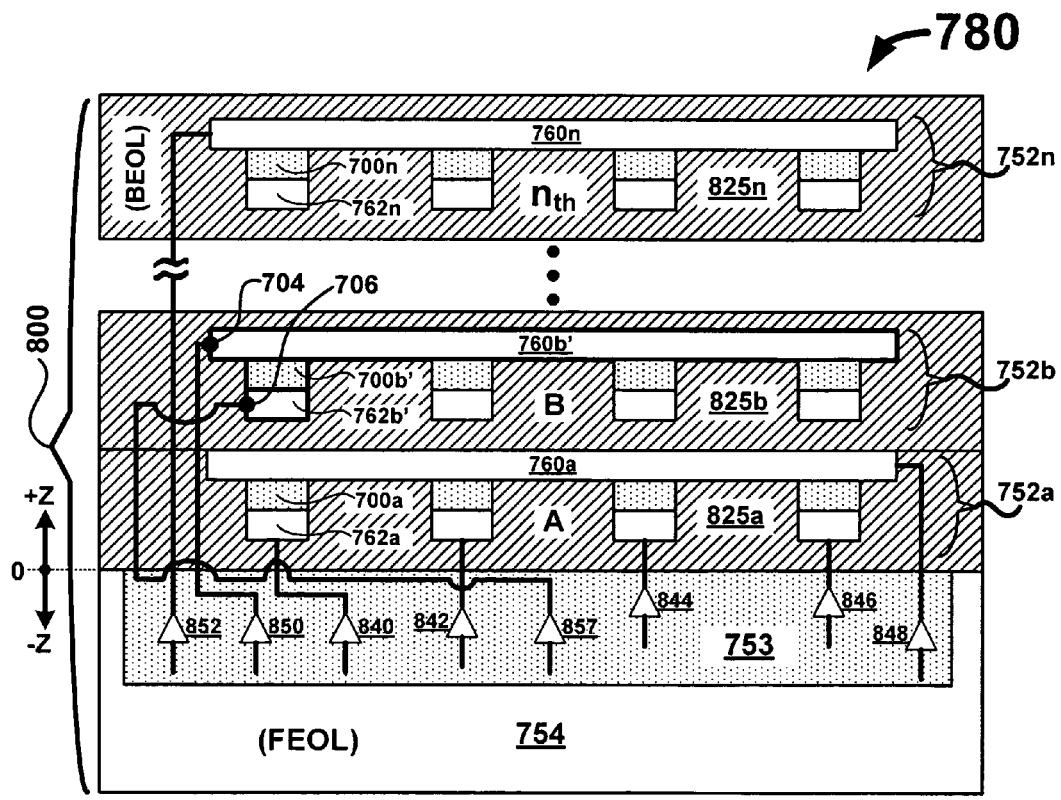
FIG. 8B depicts a cross-sectional view of an integrated circuit die including vertically stacked layers of memory fabricated over a substrate including active circuitry fabricated on the substrate in a logic layer.

Moving now to FIG. 8B, an integrated circuit 780 includes a plurality of non-volatile memory arrays that are vertically stacked above one another (e.g., along a +Z axis) and are positioned above the base layer 754 that includes the active circuitry 753. The integrated circuit 780 includes vertically stacked memory layers A and B and may include additional memory layers up to an nth memory layer. The memory layers A, B, . . . through the nth layer can be electrically coupled with the active circuitry 753 in the base layer 754 by an inter-level interconnect structure as was described above. Layer A includes memory cells 700a and first and second conductive array lines (760a, 762a), Layer B includes memory cells 700b and first and second conductive array lines (760b, 762b), and if the nth layer is implemented, then the nth layer includes memory cells 700n and first and second conductive array lines (760n, 762n). Dielectric materials 825a, 825b, and 825n (e.g., $SiO_2$) may be used where necessary to provide electrical insulation between elements of the integrated circuit 820. Active circuits 840-857 can be configured to apply the select voltage potentials (e.g., read and write voltage potentials) to selected conductive array lines (e.g., 760a, b, . . . n, and 762a, b, . . . n). Driver circuits 850 and 857 are activated to select conductive array lines 760' and 762' to select memory cell 700b' for a data operation. As was described above, the active circuits 753 can be used to sense the read current $I_R$ (not shown) from selected memory cells 700b' during a read operation and can be configured to apply the un-select voltage potential to the un-selected array lines. As described above, the integrated circuit 780 comprises the die 800 that is a unitary whole comprised of a FEOL circuitry portion fabricated on base layer 754 and a BEOL memory portion having multiple memory layers that is in contact with the FEOL portion and is fabricated directly on top of the FEOL portion.

Figure 8C:
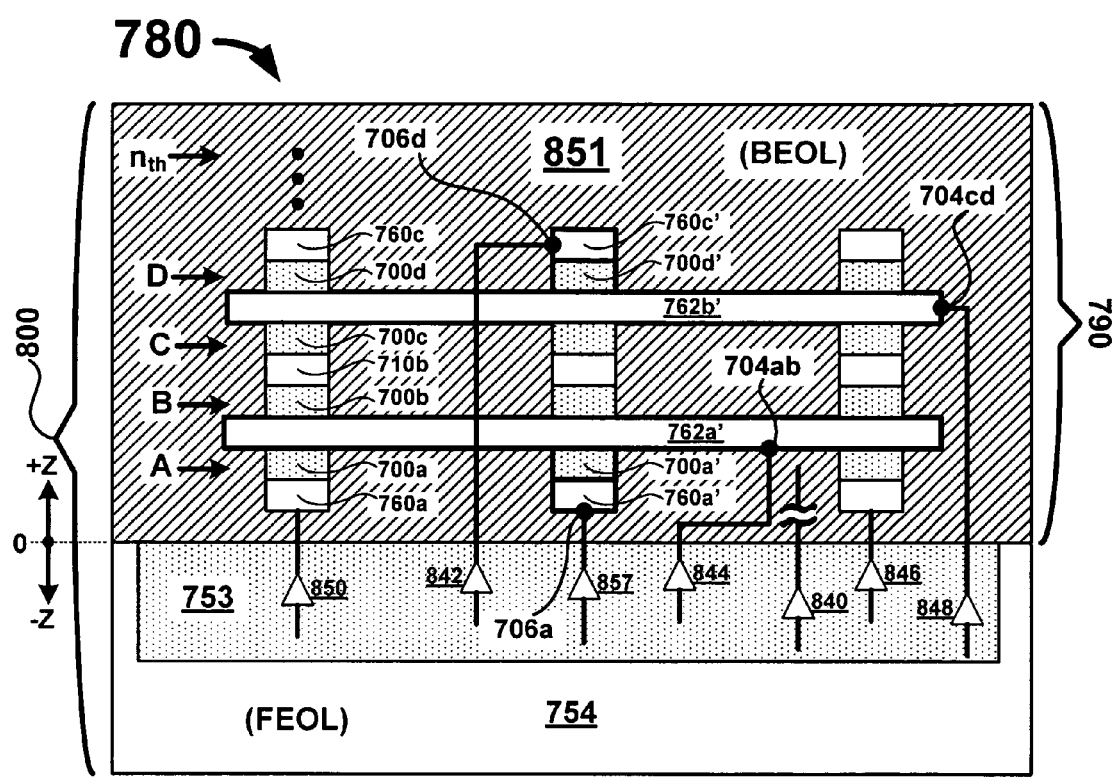
FIG. 8C depicts an integrated circuit die including vertically stacked layers of memory with shared conductive array lines fabricated over a substrate including active circuitry fabricated on the substrate in a logic layer.

In FIG. 8C, an integrated circuit 780 includes base layer 754, active circuitry 753, and vertically staked memory layers A, B, C, and D that are fabricated above the base layer 754. Active circuits 840-857 are configured to perform data operations on the vertically staked memory layers A, B, C, and D. Driver circuits 844 and 857 are activated to select memory cell 700a' for a data operation and driver circuits 842 and 848 are activated to select memory cell 700d' for a data operation. A dielectric layer 851 is operative to electrically isolate the various components of integrated circuit 780. As described above, the integrated circuit 780 comprises the die 800 that is a unitary whole comprised of a FEOL circuitry portion fabricated on base layer 754 and a BEOL memory portion having multiple memory layers that is in contact with the FEOL portion and is fabricated directly on top of the FEOL portion.

Figure 9:
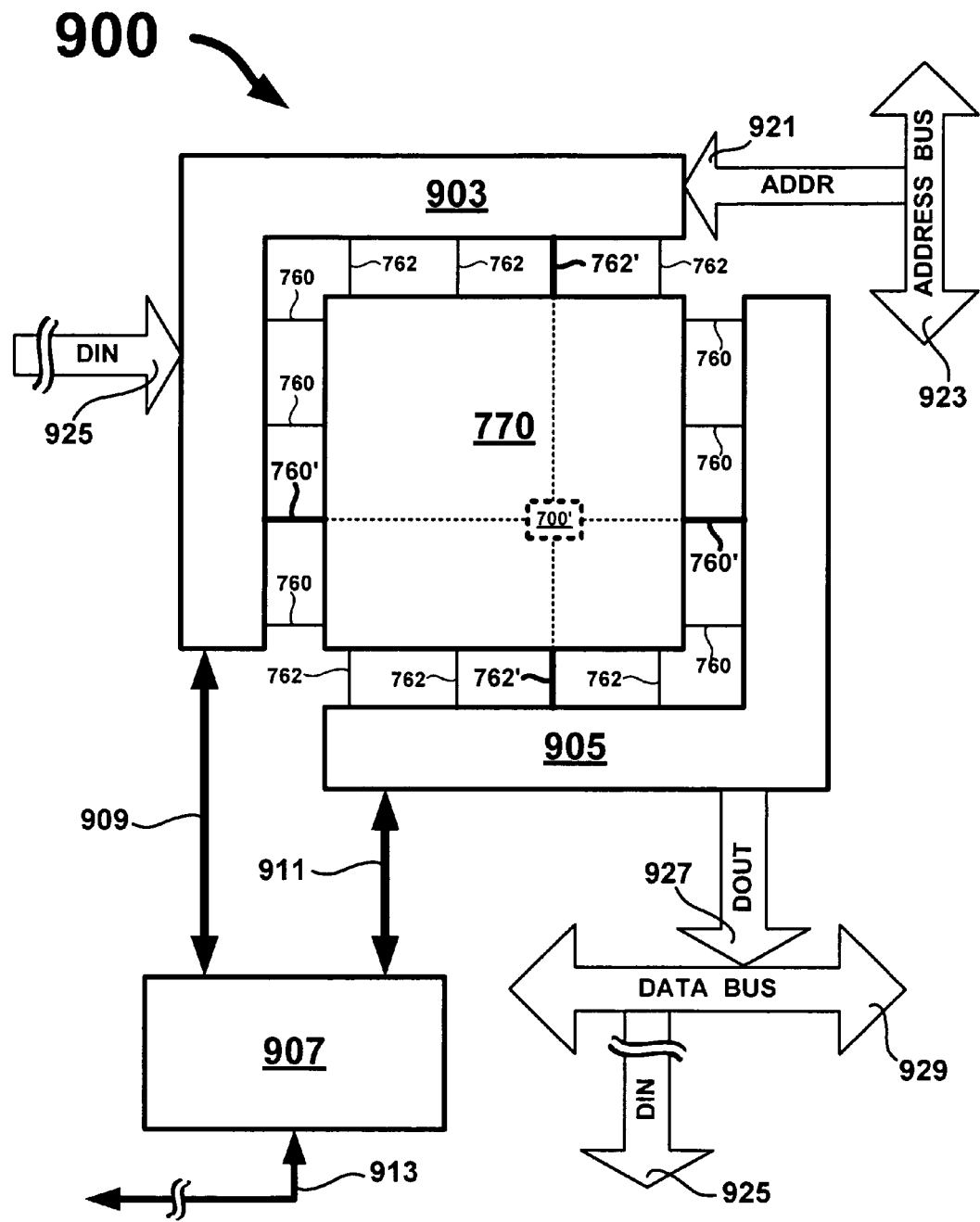
FIG. 9 depicts a memory system including a non-volatile two-terminal cross-point array.

Moving on to FIG. 9, an exemplary memory system 900 includes the aforementioned non-volatile two-terminal cross-point memory array 770 (array 770 hereinafter) and the plurality of first conductive and second conductive traces denoted as 760 and 762, respectively. The memory system 900 also includes an address unit 903 and a sense unit 905. The address unit 903 receives an address ADDR, decodes the address, and based on the address, selects at least one of the plurality of first conductive traces (denoted as 760') and one of the plurality of second conductive traces (denoted as 762'). The address unit 903 applies select voltage potentials (e.g., read or write voltages) to the selected first and second conductive traces 760' and 762'. The address unit 903 also applies a non-select voltage potential to unselected traces 760 and 762. The sense unit 905 senses one or more currents flowing through one or more of the conductive traces. During a read operation to the array 770, current sensed by the sense unit 905 is indicative of stored data in a memory cell 700' positioned at an intersection of the selected first and second conductive traces 760' and 762'. A bus 921 coupled with an address bus 923 can be used to communicate the address ADDR to the address unit 903. The sense unit 905 processes the one or more currents and at least one additional signal to generate a data signal DOUT that is indicative of the stored data in the memory cell. In some embodiments, the sense unit 905 may sense current flowing through a plurality of memory cells and processes those currents along with additional signals to generate a data signal DOUT for each of the plurality of memory cells. A bus 927 communicates the data signal DOUT to a data bus 929. During a write operation to the array 770, the address unit 903 receives write data DIN to be written to a memory cell specified by the address ADDR. A bus 925 communicates the write data DIN from the data bus 929 to the address unit 903. The address unit 903 determines a magnitude and polarity of the select voltage potentials to be applied to the selected first and second conductive traces 760' and 762' based on the value of the write data DIN. For example, one magnitude and polarity can be used to write a logic "0" and a second magnitude and polarity can be used to write a logic "1". In other embodiments, the memory system 900 can include dedicated circuitry that is separate from the address unit 903 to generate the select potentials and to determine the magnitude and polarity of the select potentials.

One skilled in the art will appreciate that the memory system 900 and its components (e.g., 903 and 905) can be electrically coupled with and controlled by an external system or device (e.g., a microprocessor or a memory controller). Optionally, the memory system 900 can include at least one control unit 907 operative to coordinate and control operation of the address and sense units 903 and 905 and any other circuitry necessary for data operations (e.g., read and write operations) to the array 770. Although only one array 770 is depicted, the array 770 can comprise a single layer of memory (e.g., 752) or multiple layers of vertically stacked memory (752a, 752b, . . . 752n) as depicted in FIGS. 7A-8C. One or more signal lines 909 and 911 can electrically couple the control unit 907 with the address and sense units 903 and 905. The control unit 907 can be electrically coupled with an external system (e.g., a microprocessor or a memory controller) through one or more signal lines 913. Here, control unit 907 can implement some or all of the FEOL circuitry described above in reference to FIGS. 1A-6.

As was described above in reference to FIGS. 7A through 8C, one or more of the arrays 770 can be positioned over a substrate 754 that includes active circuitry 753 and the active circuitry 753 can be electrically coupled with the array(s) 770 using an interconnect structure that couples signals from the active circuitry 753 with the conductive array lines 760 and 762. In FIG. 9, the busses, signal lines, control signals, the address, sense, and control units 903, 905, and 907 can comprise the active circuitry 753 and its related interconnect, and can be fabricated FEOL on the substrate 754 (e.g., a silicon wafer) using a microelectronics fabrication technology, such as CMOS, for example. The circuitry, busses, and control signals depicted in FIG. 9 can implement the aforementioned compress engine and associated circuitry (e.g., FEOL circuitry in the logic layers depicted in FIGS. 1A-6) and the array 770 can be used to implement the one or more memory layers (e.g., BEOL memory planes in FIGS. 1A-6).

Although FIGS. 7B and 8A depict single layer arrays, the BEOL memory can be configured to have a plurality of separate arrays on a single plane with some of the plurality of arrays used for the data area (e.g., data area 602) and other of the plurality of arrays used for the copy area (e.g., copy area 604). In this configuration, the arrays for the data area and the copy area are disposed on the same memory plane in horizontal relationship to one another (see FIG. 3C). Therefore, the configurations depicted in FIGS. 1A-6 need not be restricted to vertical only configurations. The BEOL memory can be flexibly configured into horizontal only configurations, vertically stacked configurations (e.g., FIGS. 2-4), or a combination of both horizontal and vertical configurations. In applications that require a small amount of data storage with redundancy to protect data integrity, it may be more efficient to implement the storage for the data area and the copy area in a single layer or plane of memory in which the aforementioned plurality of horizontally disposed separate arrays are used. On the other hand, for large data storage requirements such as in RAID systems and SSD, it may be more efficient to use the vertically stacked memory planes for the data area and the copy area with some planes being used as the copy area for the copy data only and other planes being used as the data area for the data as was described above.

Figure 10:
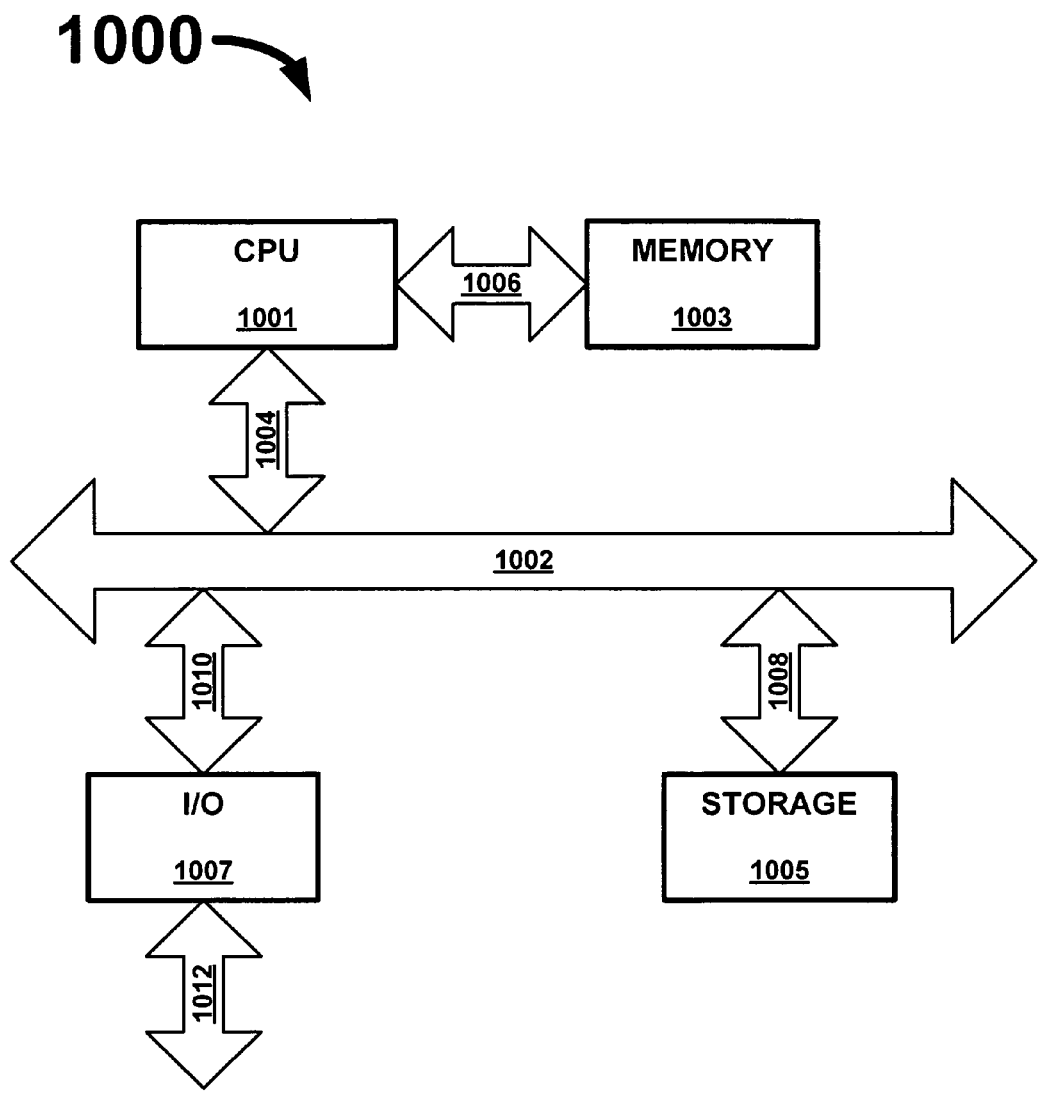
FIG. 10 depicts an exemplary electrical system that includes at least one non-volatile two-terminal cross-point array.

Reference is now made to FIG. 10, where an electrical system 1000 includes a CPU 1001 that is electrically coupled 1004 with a bus 1002, an I/O unit 1007 that is electrically coupled 1010 with the bus 1002, and a storage unit 1005 that is electrically coupled 1008 with the bus 1002. The I/O unit 1007 is electrically coupled 1012 to external sources (not shown) of input data and output data. The CPU 1001 can be any type of processing unit including but not limited to a microprocessor (µP), a micro-controller (µC), and a digital signal processor (DSP), for example. Via the bus 1002, the CPU 1001, and optionally the I/O unit 1007, performs data operations (e.g., reading and writing data) on the storage unit 1005. The storage unit 1005 stores at least a portion of the data in the aforementioned non-volatile two-terminal cross-point array as depicted in FIGS. 7A through 8C. Each memory array includes a plurality of the two-terminal memory cells 700. The configuration of the storage unit 1005 will be application specific. Example configurations include but are not limited to one or more single layer non-volatile two-terminal cross-point arrays (e.g., 752) and one or more vertically stacked non-volatile two-terminal cross-point arrays (e.g., 752a-752n). In the electrical system 1000, data stored in the storage unit 1005 is retained in the absence of electrical power. The CPU 1001 may include a memory controller (not shown) for controlling data operations to the storage unit 1005.

Alternatively, the electrical system 1000 may include the CPU 1001 and the I/O unit 1007 coupled with the bus 1002, and a memory unit 1003 that is directly coupled 1006 with the CPU 1001. The memory unit 1003 is configured to serve some or all of the memory needs of the CPU 1001. The CPU 1001, and optionally the I/O unit 1007, executes data operations (e.g., reading and writing data) to the non-volatile memory unit 1003. The memory unit 1003 stores at least a portion of the data in the aforementioned non-volatile two-terminal cross-point array as depicted in FIGS. 7A through 8C. Each memory array can include a plurality of the two-terminal memory cells 700 with each memory cell 700 including the two-terminal memory element 702 and NOD 731. The configuration of the memory unit 1003 will be application specific. Example configurations include but are not limited to one or more single layer non-volatile two-terminal cross-point arrays (e.g., 752) and one or more vertically stacked non-volatile two-terminal cross-point arrays (e.g., 752a-752n). In the electrical system 1000, data stored in the memory unit 1003 is retained in the absence of electrical power. Data and program instructions for use by the CPU 1001 may be stored in the memory unit 1003. The CPU 1001 may include a memory controller (not shown) for controlling data operations to the non-volatile memory unit 1003. The memory controller may be configured for direct memory access (DMA). Storage 1005 and/or non-volatile memory unit 1003 can include the aforementioned compress engine and associated circuitry (e.g., FEOL circuitry in FIGS. 1A-6) for implementing data compression as described herein.

Figure 11:
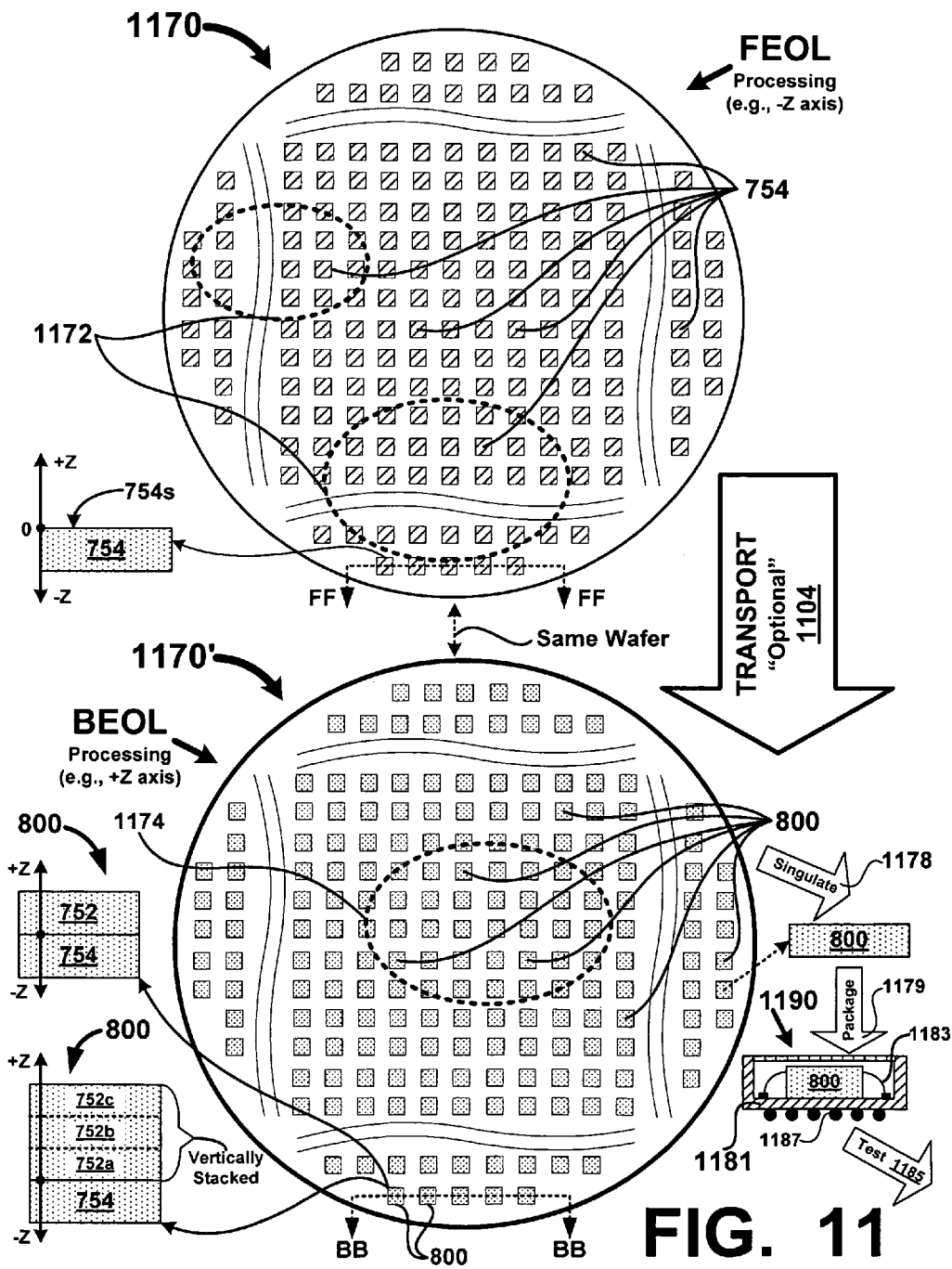
FIG. 11 depicts top plan views of a wafer processed FEOL to form a plurality of base layer die including active circuitry and the same wafer subsequently processed BEOL to form one or more layers of memory directly on top of the base layer die where the finished die can subsequently be singulated, tested, and packaged into integrated circuits.

Reference is now made to FIG. 11, where a top plan view depicts a single wafer (denoted as 1170 and 1170') at two different stages of fabrication: FEOL processing on the wafer denoted as 1170 during the FEOL stage of processing where active circuitry 753 is formed; followed by BEOL processing on the same wafer denoted as 1170' during the BEOL stage of processing where one or more layers of non-volatile memory are formed. Wafer 1170 includes a plurality of the base layer die 754 (see 106 and 220 in FIGS. 1A and 2 respectively) formed individually on wafer 1170 as part of the FEOL process. As part of the FEOL processing, the base layer die 754 may be tested 1172 to determine their electrical characteristics, functionality, performance grading, etc. After all FEOL processes have been completed, the wafer 1170 is optionally transported 1104 for subsequent BEOL processing (e.g., adding one or more layers of memory such as single layer 752 or multiple layers 752a, 752b, . . . 752n) directly on top of each base layer die 754. A base layer die 754 is depicted in cross-sectional view along a dashed line FF-FF where the substrate the die 754 is fabricated on (e.g., a silicon Si wafer) and its associated active circuitry are positioned along the –Z axis. For example, the one or more layers of memory are grown directly on top of an upper surface 754s of each base layer die 754 as part of the subsequent BEOL processing.

During BEOL processing the wafer 1170 is denoted as wafer 1170', which is the same wafer subjected to additional processing to fabricate the memory layer(s) directly on top of the base layer die 754. Base layer die 754 that failed testing may be identified either visually (e.g., by marking) or electronically (e.g., in a file, database, email, etc.) and communicated to the BEOL fabricator and/or fabrication facility. Similarly, performance graded base layer die 754 (e.g., graded as to frequency of operation) may identified and communicated to BEOL the fabricator and/or fabrication facility. In some applications the FEOL and BEOL processing can be done by the same fabricator or performed at the same fabrication facility. Accordingly, the transport 1104 may not be necessary and the wafer 1170 can continue to be processed as the wafer 1170'. The BEOL process forms the aforementioned memory layer(s) directly on top of the base layer die 754 to form a finished die 800 that includes the FEOL circuitry portion 754 along the –Z axis and the BEOL memory portion along the +Z axis (see FIGS. 7B-8C). A cross-sectional view along a dashed line BB-BB depicts a memory device die 800 with a single layer of memory 752 grown directly on top of base die 754 along the +Z axis, and alternatively, another memory device die 800 with three vertically stacked layers of memory 752a, 752b, and 752c grown directly on top of base die 754 along the +Z. Finished die 800 on wafer 1170' may be tested 1174 and good and/or bad die identified. Subsequently, the wafer 1170' can be singulated 1178 to remove die 800 (e.g., die 800 are precision cut or sawed from wafer 1170') to form individual memory device die 800. The singulated die 800 may subsequently be packaged 1179 to form integrated circuits 1190 for mounting to a PC board or the like, as a component in an electrical system (not shown). Here a package 1181 can include an interconnect structure 1187 (e.g., pins, solder balls, or solder bumps) and the die 800 mounted in the package 1181 and electrically coupled 1183 with the interconnect structure 1187 (e.g., using wire bonding). The integrated circuits 1190 (IC 1190 hereinafter) may undergo additional testing 1185 to ensure functionality and yield. One or more of the IC's 1190 can be used in a data storage system such as a RAID storage system in which the non-volatile memory in the one or more layers of memory in each IC 1190 is used to replace or supplant HDD's in the RAID system. Unlike FLASH non-volatile memory, the IC's 1190 do not require an erase operation prior to a write operation so the latency associated with the erase operation is eliminated and the latency associated with FLASH OS and/or FLASH file system required for managing the erase operation is eliminated. Another application for the IC's 1190 is as a replacement for conventional FLASH-based non-volatile memory in SSD's. Here, one or more of the IC's 1190 can be mounted to a PC board along with other circuitry and placed in an appropriate enclosure to implement a SSD that can be used to replace a HDD. As mentioned above, the IC's 1190 do not require the erase before write operation and it associated latency and overhead. For both RAID and SSD applications, the vertically stacked memory arrays allow for increases in storage density without increasing die size because the memory arrays are fabricated above their associated active circuitry so extra memory capacity can be achieved by adding additional layers of memory above the FEOL base layer die 754. The IC 1190 can be used in embedded memory applications in which data redundancy is desirable such as in portable PC's, cell phones, PDA's, image capture devices, and the like. Moreover, the data storage density can be increased by compressing the data as described herein and storing the compressed data in one or more planes of BEOL memory.

The invention can be implemented in numerous ways, including as a system, a process, an apparatus, or a series of program instructions on a computer readable medium such as a computer readable storage medium or a computer network where the program instructions are sent over optical or electronic communication links. In general, the steps of disclosed processes can be performed in an arbitrary order, unless otherwise provided in the claims.

The foregoing description, for purposes of explanation, used specific nomenclature to provide a thorough understanding of the invention. However, it will be apparent to one skilled in the art that specific details are not required in order to practice the invention. In fact, this description should not be read to limit any feature or aspect of the present invention to any embodiment; rather features and aspects of one embodiment can readily be interchanged with other embodiments. Notably, not every benefit described herein need be realized by each embodiment of the present invention; rather any specific embodiment can provide one or more of the advantages discussed above. In the claims, elements and/or operations do not imply any particular order of operation, unless explicitly stated in the claims. It is intended that the following claims and their equivalents define the scope of the invention.

What is claimed is:

1. An apparatus, comprising:
a substrate including active circuitry fabricated on the substrate;
a third dimensional memory array in contact with and fabricated directly on top of the substrate, the third dimensional memory array configured to store an input independent of storing a compressed copy of the input;
a processor included in the active circuitry and configured to compress the input to form the compressed copy of the input; and
a controller included in the active circuitry and configured to control access between the processor and the third dimensional memory array.

2. The apparatus of claim 1, wherein the active circuitry further comprises a port circuit configured to provide a plurality of access ports to the third dimensional memory array.

3. The apparatus of claim 1, wherein the active circuitry further comprises a priority circuit configured to resolve a request from more than one of the plurality of access ports to the third dimensional memory array.

4. The apparatus of claim 1 and further comprising:
a processor memory included in a portion of the third dimensional memory array, the portion of the third dimensional memory array being configured to store data used by the processor.

5. The apparatus of claim 1, wherein the controller comprises of a scatter-gather circuit, the scatter-gather circuit being configured to locate the input across multiple memory planes in the third dimensional memory array.

6. The apparatus of claim 5, wherein the scatter-gather circuit is configured to locate the compressed copy of the input across the multiple memory planes.

7. An integrated circuit, comprising:
a substrate including active circuitry fabricated on the substrate;
a third dimensional memory array in contact with and fabricated directly above the substrate and including a memory layer, wherein the memory layer is configured to store an input independent of storing a compressed copy of the input;
a processor included in the active circuitry and configured to transform the input to form a compressed data; and
a controller included in the active circuitry and configured to control a request from the processor to access the third dimensional memory array;
a port circuit included in the active circuitry and configured to provide a plurality of access ports to the third dimensional memory array;
a priority circuit included in the active circuitry and configured to resolve multiple requests from the port circuit to access the third dimensional memory array; and
a processor memory included in a portion of the third dimensional memory array, the portion of the third dimensional memory array being configured to store data used by the processor.

8. The integrated circuit of claim 7, wherein the controller uses a scatter-gather circuit included in the active circuitry and configured to locate a first input on a common memory plane in the third dimensional memory array with a second input to form the compressed data.

9. The integrated circuit of claim 7, wherein the controller uses a scatter-gather circuit included in the active circuitry and configured to locate a first input on a different memory plane in the third dimensional memory array from a second input to form the compressed data.

10. The integrated circuit of claim 7, wherein the controller replaces the input with the compressed copy of the input.

11. The integrated circuit of claim 7, wherein the controller is operative to request the storing of the compressed copy of the input on a separate memory plane in the third dimensional memory array from the input.

12. The integrated circuit of claim 7, wherein the controller is operative to request the storing of the compressed copy of the input on a common memory plane in the third dimensional memory array to the input.

13. The integrated circuit of claim 7, wherein the controller maps a portion of the input discontinued from another portion of the input across more than one memory plane in the third dimensional memory array using a scatter-gather circuit that is included in the active circuitry.

14. The integrated circuit of claim 7, wherein the controller uses the third dimensional memory array to store the compressed copy of the input in parallel to sending the input from storage to the processor.

15. The integrated circuit of claim 7, wherein the processor is configured to compress the input prior to completing storage of the input in the third dimensional memory array.

16. The integrated circuit of claim 7 and further comprising: an analog-to-digital converter (ADC) configured to receive an input data and to generate an output data that is uncompressed and stored directly in the third dimensional memory without using a frame buffer to temporarily store the output data.

17. The integrated circuit of claim 16, wherein the uncompressed output data from the ADC is compressed during or after reception of the input data, and the output data is compressed in an operation that is independent of the storing of the input or the storing of the compressed copy of the input.

18. The integrated circuit of claim 7, wherein the processor is configured to uncompress the compressed data.

19. The integrated circuit of claim 7 and further comprising: direct memory access (DMA) circuitry included in the active circuitry and operative to perform multiple DMA transfers of data to and from the third dimensional memory array.

20. A method, comprising:
receiving an input independent of another input;
storing the input into a third dimensional memory array fabricated directly on top of a substrate that includes active circuitry fabricated on the substrate;
locating the input in the third dimensional memory array using a scatter-gather circuit included in the active circuitry;
compressing the input to form a compressed copy of the input; and
replacing the input with the compressed copy of the input.

21. The method of claim 20, wherein locating the input comprises accessing a portion of the third dimensional memory array to store a pointer to form a scatter-gather memory located in the portion of the third dimensional memory array, the scatter-gather memory is accessed by a scatter-gather circuit that is included in the active circuitry.

22. The method of claim 20, wherein compressing the input occurs in parallel to storing of the input in the third dimensional memory array.

23. The method of claim 20, wherein compressing the input comprises accessing a portion of the third dimensional memory array to store data used by a processor.

24. The method of claim 23, wherein the processor is included in the active circuitry.

25. The method of claim 20, wherein replacing the input occurs in parallel with the compressing of the input.

26. The method of claim 20 and further comprising: communicating with an external processor using a register to store the input.

27. The method of claim 20 and further comprising: communication with an external processor through direct memory access (DMA) transfers or a port logic using a mail box in the third dimensional memory.

28. The method of claim 20 and further comprising: decompressing the compressed copy of the input to generate a decompressed copy of the input.

29. The method of claim 28, wherein the decompressing comprises reading the compressed copy of the input, the processor operative to decompress the compressed copy of the input and to generate the decompressed copy of the input, and outputting the decompressed copy of the input on an at least one access port.

30. The method of claim 29 and further comprising: transferring data to and from the third dimensional memory using multiple direct memory access (DMA) transfers controlled by DMA circuitry.

31. The method of claim 30, wherein the DMA circuitry is included with the active circuitry on the substrate.

* * * * *